(12) United States Patent
Thompson et al.

(10) Patent No.: US 11,127,917 B2
(45) Date of Patent: Sep. 21, 2021

(54) SPECTRAL EMISSION MODIFICATION USING LOCALIZED SURFACE PLASMON OF METALLIC NANOPARTICLES

(71) Applicants: Universal Display Corporation, Ewing, NJ (US); THE TRUSTEES OF THE UNIVERSITY OF PENNSYLVANIA, Philadelphia, PA (US)

(72) Inventors: Nicholas J. Thompson, Trenton, NJ (US); Cherie R. Kagan, Bala Cynwyd, PA (US); Christopher B. Murray, Bala Cynwyd, PA (US)

(73) Assignees: UNIVERSAL DISPLAY CORPORATION, Ewing, NJ (US); THE TRUSTEES OF THE UNIVERSITY OF PENNSYLVANIA, Philadelphia, PA (US)

(*) Notice: Subject to any disclaimer, the term of this patent is extended or adjusted under 35 U.S.C. 154(b) by 0 days.

(21) Appl. No.: 16/582,449

(22) Filed: Sep. 25, 2019

(65) Prior Publication Data
US 2020/0020877 A1 Jan. 16, 2020

Related U.S. Application Data

(62) Division of application No. 15/379,947, filed on Dec. 15, 2016, now abandoned.

(51) Int. Cl.
*H01L 51/52* (2006.01)
*H01L 51/50* (2006.01)
(Continued)

(52) U.S. Cl.
CPC ...... *H01L 51/5221* (2013.01); *H01L 51/0021* (2013.01); *H01L 51/5012* (2013.01);
(Continued)

(58) Field of Classification Search
CPC ............ H01L 51/5221; H01L 51/0021; H01L 51/5012; H01L 51/56; H01L 51/5056
(Continued)

(56) References Cited

U.S. PATENT DOCUMENTS

| 5,677,545 A | 10/1997 | Shi et al. |
| 6,670,772 B1 | 12/2003 | Arnold et al. |

(Continued)

FOREIGN PATENT DOCUMENTS

| CN | 1612661 | 5/2005 |
| JP | 2002-124387 | 4/2002 |

(Continued)

OTHER PUBLICATIONS

Yang, Ki Youl et al. "Surface plasmon-enhanced spontaneous emission rate in an organic light-emitting device structure: Cathode structure for plasmonic application" Applied Physics Letters 94, 173301 (2009).

(Continued)

*Primary Examiner* — Robert T Huber
(74) *Attorney, Agent, or Firm* — Duane Morris LLP

(57) ABSTRACT

A method for engineering a line shape of emission spectrum of an organic emissive material in an electroluminescent device is disclosed in which a layer of plasmonic metallic nanostructures having a localized surface plasmonic resonance (LSPR) is provided in proximity to the emissive layer and the layer of plasmonic metallic nanostructures is greater than 2 nm but less than 100 nm from the emissive layer and the LSPR of the plasmonic metallic nanostructures matches the emission wavelength of the organic emissive material. An electroluminescent device incorporating the plasmonic metallic nanostructures is also disclosed.

27 Claims, 8 Drawing Sheets

(51) Int. Cl.
*H01L 51/56* (2006.01)
*H01L 51/00* (2006.01)

(52) U.S. Cl.
CPC ...... *H01L 51/5016* (2013.01); *H01L 51/5056* (2013.01); *H01L 51/5072* (2013.01); *H01L 51/56* (2013.01)

(58) Field of Classification Search
USPC .................. 257/40, E51.018; 438/22, 29
See application file for complete search history.

(56) References Cited

U.S. PATENT DOCUMENTS

| | | |
|---|---|---|
| 6,852,252 B2 | 2/2005 | Halas et al. |
| 6,853,134 B2 | 2/2005 | Ueno et al. |
| 6,946,319 B2 | 9/2005 | Stegamat et al. |
| 7,944,564 B2 | 5/2011 | Utsunomiya et al. |
| 8,101,941 B2 | 1/2012 | Choulis et al. |
| 8,367,434 B2 | 2/2013 | Mary et al. |
| 2001/0000335 A1 | 4/2001 | Yamada et al. |
| 2001/0033135 A1 | 10/2001 | Duggal et al. |
| 2002/0038867 A1 | 4/2002 | Kobori et al. |
| 2003/0003300 A1 | 1/2003 | Korgel et al. |
| 2003/0111955 A1 | 6/2003 | McNulty et al. |
| 2004/0217696 A1 | 11/2004 | Kim et al. |
| 2005/0035346 A1 | 2/2005 | Bazan et al. |
| 2005/0069726 A1 | 3/2005 | Douglas et al. |
| 2005/0088078 A1 | 4/2005 | Tseng et al. |
| 2005/0146724 A1 | 7/2005 | Malak |
| 2005/0158523 A1 | 7/2005 | Gupta et al. |
| 2005/0276993 A1 | 12/2005 | Sohn et al. |
| 2006/0131569 A1 | 6/2006 | Choi et al. |
| 2007/0063628 A1 | 3/2007 | Cok et al. |
| 2007/0069199 A1 | 3/2007 | Choulis et al. |
| 2007/0077594 A1 | 4/2007 | Hikmet et al. |
| 2008/0157665 A1 | 7/2008 | Wu et al. |
| 2011/0031474 A1 | 2/2011 | Bechtel et al. |
| 2011/0187264 A1 | 8/2011 | Yasuda et al. |
| 2012/0032138 A1 | 2/2012 | Kim et al. |
| 2012/0313129 A1 | 12/2012 | Zettsu et al. |
| 2013/0105770 A1 | 5/2013 | Pschenitzka |
| 2015/0084017 A1 | 3/2015 | Dai et al. |
| 2015/0228929 A1 | 8/2015 | Lamansky et al. |

FOREIGN PATENT DOCUMENTS

| | | |
|---|---|---|
| JP | 2004-335438 | 11/2004 |
| JP | 2005-135920 | 5/2005 |
| KR | 10-1619475 | 5/2016 |
| WO | 2004/086823 | 10/2004 |
| WO | 2005/055330 | 6/2005 |
| WO | 2016014983 | 1/2016 |

OTHER PUBLICATIONS

Xiao, Y. et al., "Surface plasmon-enhanced electroluminescence in organic light-emitting diodes incorporating Au nanoparticles" Applied Physics Letters 100, 013308 (2012).

Hobson, Peter A. et al. "Surface Plasmon Mediated Emission from Organic Light-Emitting Diodes" Adv. Mater. 2002, 14, No. 19, Oct. 2, pp. 1393-1396.

Choulis, Stelios A. et al. "Influence of metallic nanoparticles on the performance of organic electrophosphorescence devices" Applied Physics Letters 88, 213503 (2006).

Kumar, Arunandan et al. "Surface plasmon enhanced blue organic light emitting diode with nearly 100% fluorescence efficiency" Organic Electronics 13 (2012) 1750-1755.

Fujiki, A. et al., "Enhanced fluorescence by surface plasmon coupling of AU nanoparticles in an organic electroluminescence diode" Applied Physics Letters 96, 043307 (2010).

Ding, Wei et al., "Plasmonic Nanoactivity Organic Light-Emitting Diode with Significantly Enhanced Light Extraction, Contrast, Viewing Angle, Brightness, and Low-Glare" Adv. Funct. Mater. 2014, 24, 6329-6339.

Gu, Xuefeng et al., "Light-emitting diodes enhanced by localized surface plasmon resonance" Nanoscale Research Letters 2011, 6:199, pp. 1-12.

Seth Coe-Sullivan et al., "Tuning the performance of hybrid organic/inorganic quantum dot light-emitting devices", Sep. 2003, Organic Electronics, vol. 4, No. 2/3, pp. 123-130.

Jong Hyeok Park, et al., "Polymer/Gold Nanoparticle Nanocomposite Light-Emitting Diodes: Enhancement of Electroluminescence Stability and Quantum Efficiency of blue-Light-Emitting Polymers," American Chemical Society, Chem. Matter, vol. 16, No. 4, 2004; pp. 688-692.

International Search Report and Written Opinion dated Mar. 30, 2018 issued in corresponding PCT Application No. PCT/US2017/065974.

SPECTRAL EMISSION MODIFICATION USING LOCALIZED SURFACE PLASMON OF METALLIC NANOPARTICLES

CROSS-REFERENCE TO RELATED APPLICATION

This application is a divisional of U.S. application Ser. No. 15/379,947, filed Dec. 15, 2016, the entirety of which is incorporated herein by reference.

JOINT RESEARCH AGREEMENT

The claimed invention was made by, on behalf of, and/or in connection with the following parties to a joint university corporation research agreement: University of Pennsylvania and Universal Display Corporation. The agreement was in effect on and before the date the claimed invention was made, and the claimed invention was made as a result of activities undertaken within the scope of the agreement.

FIELD OF THE INVENTION

The present invention relates generally to organic light emitting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

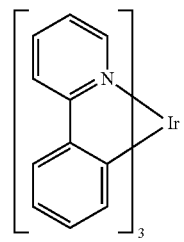

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an aspect of the present disclosure, a method for engineering a line shape of emission spectrum of an organic emissive material in an electroluminescent device is disclosed, wherein the electroluminescent device comprises an anode layer, a cathode layer, and an emissive layer disposed in between the anode and the cathode layers, wherein an organic emissive material is provided in the emissive layer. The method comprises: providing a layer of plasmonic metallic nanostructures having a localized surface plasmonic resonance (LSPR) in proximity to the emissive layer, wherein the layer of plasmonic metallic nanostructures is greater than 2 nm from but less than 100 nm from the emissive layer, and the wavelength of the maximum extinction of the LSPR of the layer of plasmonic metallic nanostructures is within ±10 nm of the peak emission wavelength of the organic emissive material and more preferably within ±5 nm of the peak emission wavelength of the organic emissive material.

According to another aspect of the present disclosure, an electroluminescent device comprising an anode layer, a cathode layer, and a stack of layers disposed between the anode layer and the cathode layer is disclosed. The stack of layers includes an emissive layer and a first layer of plasmonic metal nanostructures. The emissive layer includes an organic emissive material having an emission wavelength, and the first layer of plasmonic metal nanostructures has a LSPR, wherein the layer of plasmonic metal nanostructures is great than 2 nm from but less than 100 nm from the emissive layer and the LSPR of the layer of plasmonic metal nanostructures is within ±10 nm of the peak emission wavelength of the organic emissive material and more preferably within ±5 nm of the peak emission wavelength of the organic emissive material.

According to some embodiments, an electroluminescent device comprising an anode layer, a cathode layer, and a stack of layers disposed between the anode layer and the cathode layer is disclosed. The stack of layers comprises: an emissive layer comprising an organic emissive material, the organic emissive material having an emission wavelength; a hole transporting layer disposed between the emissive layer and the anode layer; and an electron transporting layer disposed between the emissive layer and the cathode, wherein the anode layer or the cathode layer is a layer of plasmonic metal nanostructures having a LSPR, wherein the layer of plasmonic metal nanostructures is greater than 2 nm from but less than 100 nm from the emissive layer and the LSPR of the layer of plasmonic metal nanostructures is within ±10 nm of the peak emission wavelength of the organic emissive material and more preferably within ±5 nm of the peak emission wavelength of the organic emissive material.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
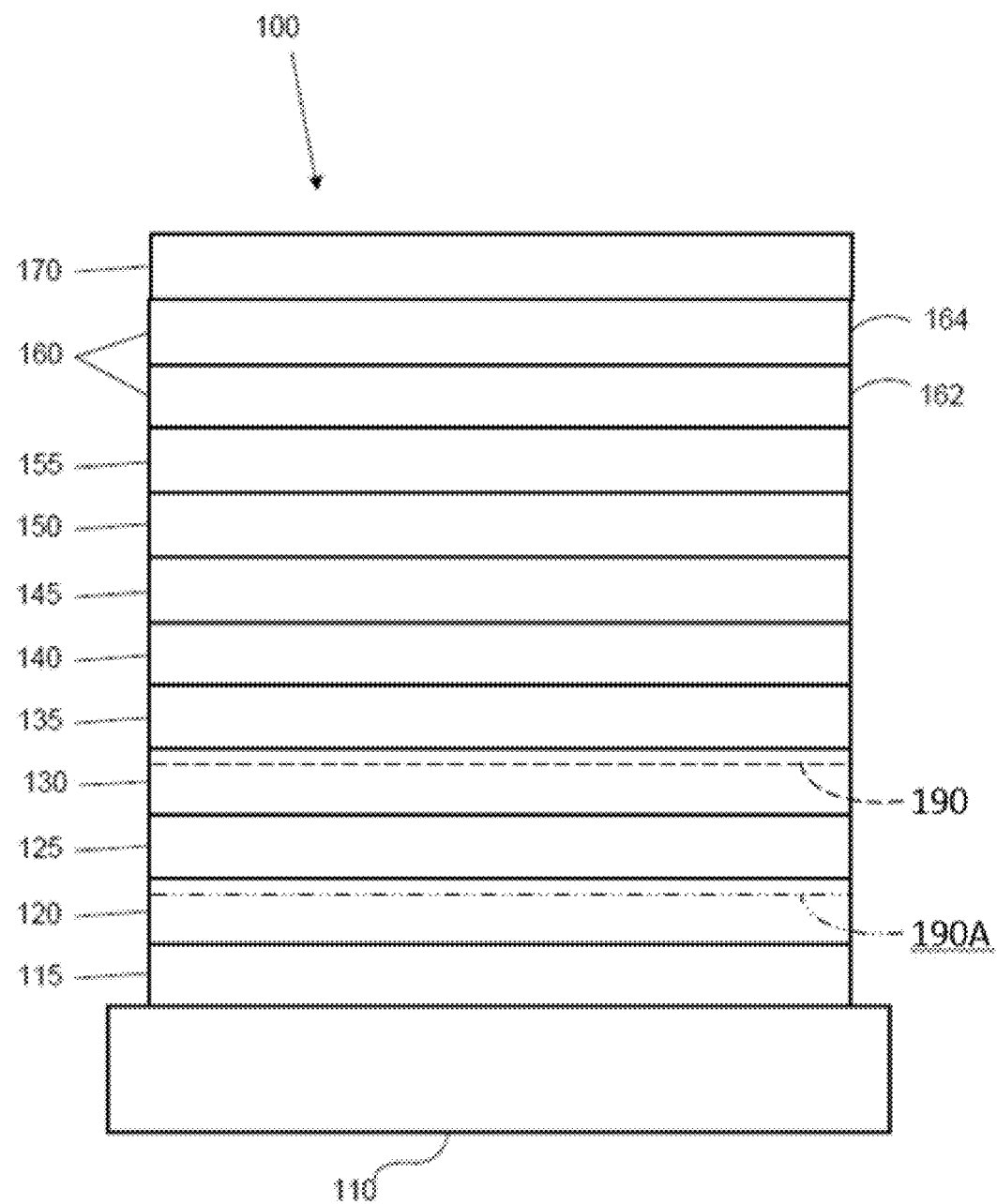
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160, and a barrier layer 170. Cathode 160 is a compound cathode having a first conductive layer 162 and a second conductive layer 164.

Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
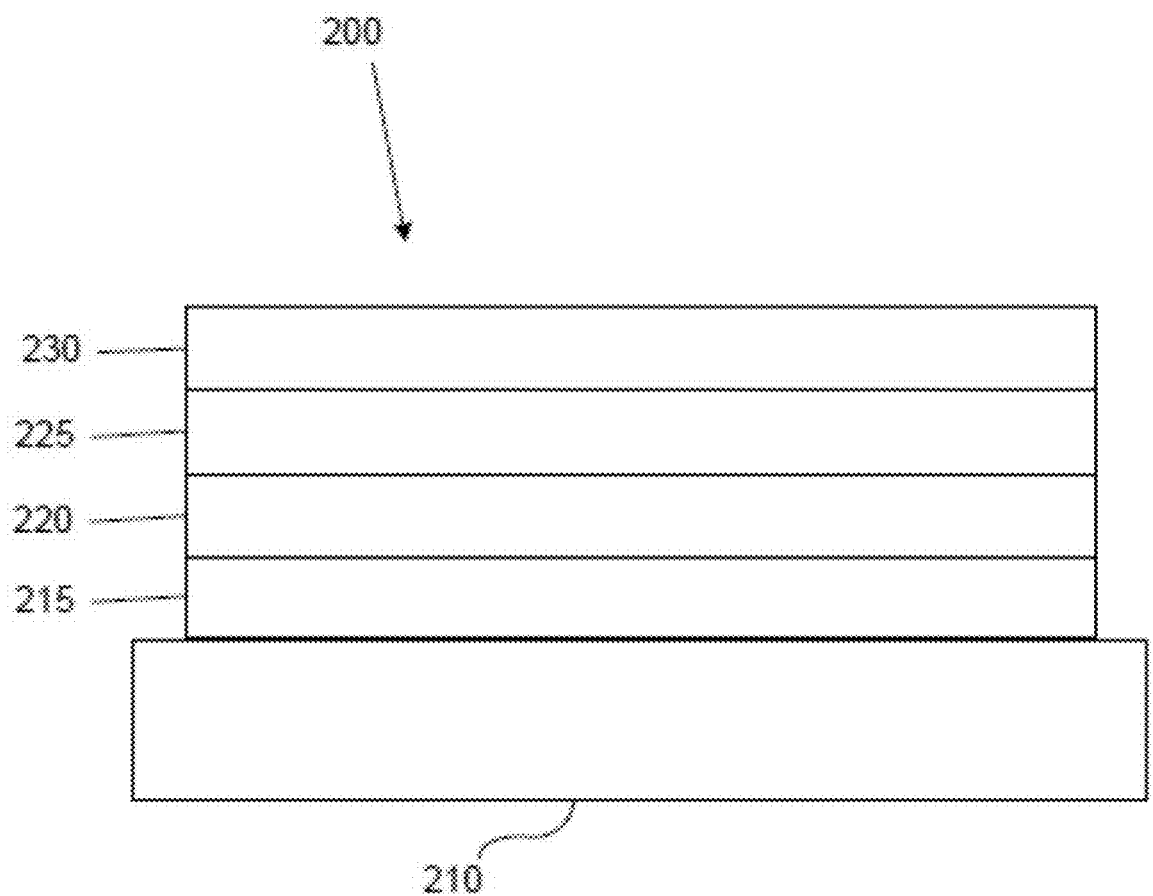
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are also defined in U.S. Pat. No. 7,279,704 at cols. 31-32, which are incorporated herein by reference.

The emission spectrum line shape and spectral width of emission are intrinsic properties of the chemical composition of organic dyes. For optoelectronic devices such as OLEDs, modification of the intrinsic emission spectrum through device engineering rather than chemistry is advantageous to increase color saturation, color rendering index, and efficiency. The conventional way of modifying or tuning emission spectrum line shape by device engineering is by introducing an optical cavity. This, however, creates trade-offs between the spectral line shape, the direction of emission, and efficiency. Optical cavities are typically narrow in bandwidth. Thus, there is a need for an improved way of modifying the emission spectrum line shape by other avenues of device engineering.

The inventors have unexpectedly discovered that the line shape of the emission of organic emissive dopants in optoelectronic devices can be modified or tuned using plasmonic metal nanostructures, in the form of either patterned metal films or colloidal nanoparticles. The plasmonic metal nanostructures, when in proximity to emissive materials, can modify the spectral line shape of emission. This find was unexpected as the spectral line shape is assumed to be an inherent property of the molecule which cannot be modified. This is made possible through the careful optimization of the localized surface plasmon resonance (LSPR) of the plasmonic metal nanostructures. We find a large line shape modification when the wavelength of the maximum extinction (i.e. absorption and scattering) of the LSPR of the plasmonic metal nanostructure is within ±10 nm of the peak emission wavelength of the organic emissive material and more preferably within ±5 nm of the peak emission wavelength of the organic emissive material. Further, inventors believe that the plasmonic metal nanostructures can be used to modify the peak wavelength of the emitter which previously is something only thought possible through the use of an optical cavity.

The collective oscillations of electrons in the plasmonic metal nanostructures that are excited by light creates strong electric fields at energies characteristic of the plasmonic metal nanostructure LSPR. These strong electric fields alter the environment and therefore the quantum yield and emission rate of an organic dye (i.e. an emitter) placed in proximity to the plasmonic metal nanostructure. Incorporation of plasmonic metal nanostructures with the energy of LSPR tuned to a specific value allows for independent tuning of emission spectrum line shape, angular dependence, and polarization of emission of organic dyes in optoelectronic devices.

According to some embodiments, a method for engineering the line shape of the emission spectrum of an organic emissive material in an electroluminescent device is disclosed, wherein the electroluminescent device comprises an anode layer, a cathode layer, and an emissive layer disposed in between the anode and the cathode layers, wherein an organic emissive material is provided in the emissive layer. The method comprises: providing a layer of plasmonic metallic nanostructures having a LSPR in proximity to the emissive layer, wherein the layer of plasmonic metallic nanostructures is greater than 2 nm from but less than 100 nm from the emissive layer and the wavelength of the maximum extinction of the LSPR of the layer of plasmonic metallic nanostructures is within ±10 nm of the peak emission wavelength of the organic emissive material and more preferably within ±5 nm of the peak emission wavelength of the organic emissive material.

Referring to FIG. 1, according to some embodiments, an improved electroluminescent device 100 incorporating teachings of this disclosure is disclosed. The electroluminescent device comprises: an anode layer 115; a cathode layer 160: and a stack of layers disposed between the anode layer and the cathode layer. The stack of layers include: an emissive layer 135 comprising an organic emissive material, the organic emissive material having an emission wavelength; and a first layer 190 of plasmonic metal nanostructures having a localized surface plasmonic resonance (LSPR) disposed with the stack of layers, wherein the layer of plasmonic metal nanostructures is greater than 2 nm from but less than 100 nm from the emissive layer and the wavelength of the maximum extinction of the LSPR of the layer of plasmonic metal nanostructures is tuned to be within ±10 nm of the peak emission wavelength of the organic emissive material and more preferably within ±5 nm of the peak emission wavelength of the organic emissive material.

The limits of greater than 2 nm but less than 100 nm from the emissive layer for the metal nanostructures depend on both the size and the composition of the metal nanostructures. The 2 nm limit comes from quenching of the luminescence of the emitter by energy transfer/charge transfer to the metal nanoparticle. Technically, this does depend on the density of states of the metal, although inventors believe that this has a weaker dependence on size and composition than the long length scale for most systems that would be selected for this application. On the longer side, the 100 nm limit does matter as not only the energy, but the strength of the plasmon resonance and the associated field depends on size and composition of the metal nanostructures.

The optimal distance of the metal nanostructures from the emissive layer within the specified limits will depend on the composition and size of the metal nanostructures as these will affect the energy and strength of the plasmon resonance. The optimal distance of the metal nanostructures from the emissive layer also depends on the thickness of the emissive layer because the emitter dopant compounds are dispersed within the emissive layer. The optimal thickness for the emissive layer is less than or equal to 100 nm and preferably less than or equal to 50 nm.

The limits are encompassing to capture the length scales at which the enhancement would be active for a broad range of metal nanostructure sizes and compositions.

Referring to FIG. 1, according to some embodiments of the electroluminescent device, the stack of layers comprises: a hole transporting layer (HTL) 125 disposed between the emissive layer 135 and the anode layer 115, and wherein the first layer of plasmonic metal nanostructures is disposed between the HTL and the anode layer. This alternate location of the first layer of plasmonic metal nanostructure is identified by 190A in FIG. 1. According to some embodiments, the first layer of plasmonic metal nanostructures has a thickness and comprises a plurality of plasmonic metal nanostructures having a feature size and the thickness of the first layer of plasmonic metal nanostructures is selected to result in the wavelength of the maximum extinction of the LSPR of the first layer of plasmonic metal nanostructures to be within ±10 nm of the peak emission wavelength of the organic emissive material and more preferably within ±5 nm of the peak emission wavelength of the organic emissive material.

According to some embodiments, the first layer of plasmonic metal nanostructures has a thickness and comprises a plurality of plasmonic metal nanoparticles having a particle size, wherein the particle size of the plurality of plasmonic metal nanoparticles is selected to result in the wavelength of the maximum extinction of the LSPR of the first layer of plasmonic metal nanoparticles be within ±10 nm of the peak emission wavelength of the organic emissive material and more preferably within ±5 nm of the peak emission wavelength of the organic emissive material.

According to some embodiments, the stack of layers comprising an electron transporting layer (ETL) disposed between the emissive layer and the cathode layer, wherein the first layer of plasmonic metal nanostructures is disposed between the ETL and the cathode layer. According to some embodiments, the first layer of plasmonic metal nanostructures has a thickness and comprises a plurality of plasmonic metal nanostructures having a particle size and the thickness of the first layer of plasmonic metal nanostructures selected to result in the wavelength of the maximum extinction of the LSPR of the first layer of plasmonic metal nanostructures being within ±10 nm of the peak emission wavelength of the organic emissive material and more preferably within ±5 nm of the peak emission wavelength of the organic emissive material.

According to some embodiments, the stack of layers further comprising a hole transport layer (HTL) disposed between the emissive layer and the anode layer, and wherein a second layer of plasmonic metal nanostructures is disposed between the HTL and the anode layer. In some embodiments, each of the first and second layers of plasmonic metal nanostructures has a thickness and comprises a plurality of plasmonic metal nanostructures having a feature size and the thickness of each of the first and second layers of plasmonic metal nanostructures is selected to result in the wavelength of the maximum extinction of the LSPR of the first and second layers of plasmonic metal nanostructures be within ±10 nm of the peak emission wavelength of the organic emissive material and more preferably within ±5 nm of the peak emission wavelength of the organic emissive material.

According to some embodiments, each of the first and second layers of plasmonic metal nanostructures are a plurality of plasmonic metal nanoparticles having a particle size selected to result in the wavelength of the maximum extinction of the LSPR of the first and second layers of plasmonic metal nanoparticles be within ±10 nm of the peak emission wavelength of the organic emissive material and more preferably within ±5 nm of the peak emission wavelength of the organic emissive material.

Figure 7:
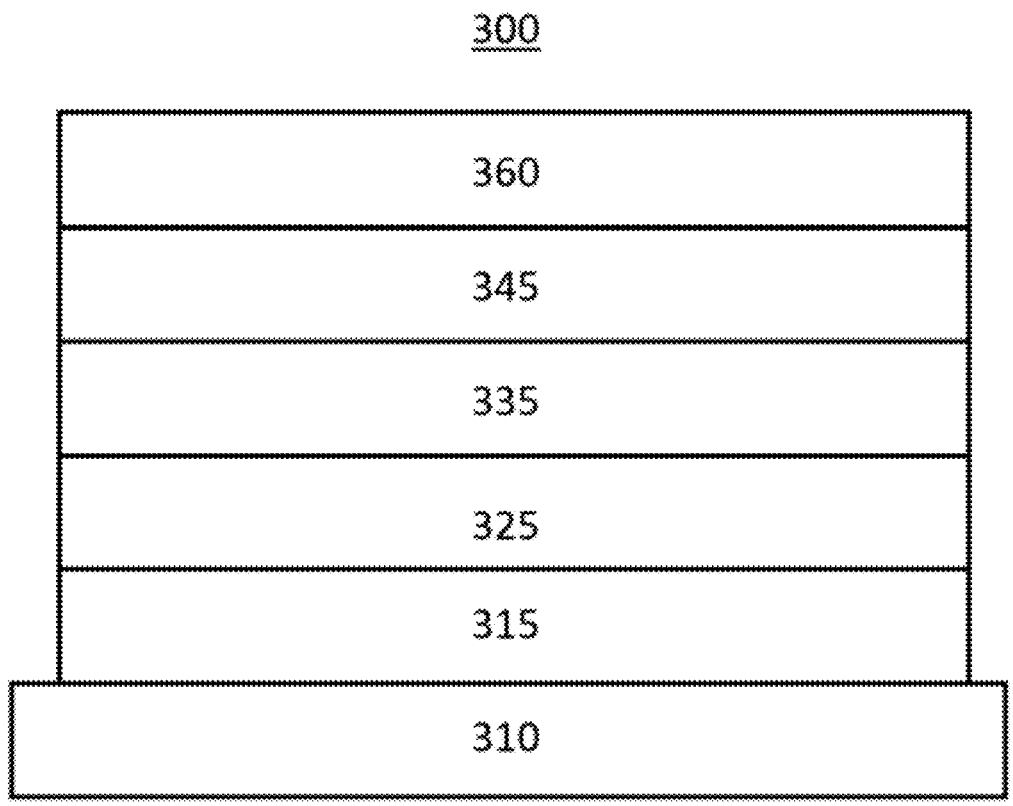
FIG. 7 shows an organic light emitting device according to another embodiment of the present disclosure.

Referring to FIG. 7, according to another aspect of the present disclosure, an electroluminescent device 300 comprising the following is disclosed:
 an anode layer 315;
 a cathode layer 360: and
 a stack of layers disposed between the anode layer and the cathode layer, said stack of layers including: an emissive layer 335 comprising an organic emissive material, the organic emissive material having an emission wavelength; a hole transporting layer 325 disposed between the emissive layer and the anode layer; and an electron transporting layer 345 disposed between the emissive layer and the cathode; wherein the anode layer 315 or the cathode layer 360 is a layer of plasmonic metal nanostructures having a localized surface plasmonic resonance (LSPR), wherein the layer (315 or 360) of plasmonic metal nanostructures is greater than 2 nm from but less than 100 nm from the emissive layer and the wavelength of the maximum extinction of the LSPR of the layer of plasmonic metal nanostructures is tuned to match the emission wavelength of the organic emissive material.

In some embodiments of the electroluminescent device, the plasmonic metal nanostructures are plasmonic metal nanoparticles, wherein the plasmonic metal nanoparticles have a particle size selected to result in the wavelength of the maximum extinction of the LSPR of the layer of plasmonic metal nanoparticles match the emission wavelength of the organic emissive material.

The Plasmonic Metal Nanostructures

The plasmonic metal nanostructures may be fabricated by combining the physical deposition of metal (e.g. through thermal or e-beam evaporation or sputtering) to form thin films with lithographic patterning of the metal to create the desired size and shape of the nanostructures. Alternatively, metal nanostructures may be synthesized through wet-chemical methods (e.g. solvothermal synthesis). The plasmonic metal nanostructure is selected to operate preferably in the UV or visible light range and therefore is made of a high carrier density metal, preferably Al, Ag, or Au is desired. The feature size of the plasmonic nanostructures are sub-wavelength and therefore the feature size in the range of 2-400 nm, and preferably 5-200 nm are appropriate. The feature size is the lateral dimensions for the lithographically defined structures. For example, they can look like discs that may be 100s of nanometers in diameter, but they would be thin having thickness of 10s of nanometers. The plasmonic nanostructures should not be much thicker because they would negatively affect the deposited organic layers. The nanostructures can be made into any desired shape such as discs, spheres, rods, etc. using various fabrication methods known in the art.

The combination of metal nanostructure composition, size, and shape are selected to be resonant with the wavelengths of emission of the emitters used in the OLED (e.g. for a blue emitter, ~100 nm diameter Al or ~5 nm diameter Ag nanoparticles are resonant with emission of the emitter, whereas for green and red emitters, larger Al or Ag and Au nanostructures are appropriate).

When designing the plasmonic metal nanostructure for visible wavelength emitters, the choice of metal is selected by the strength of the plasmon in different spectral regions. The strength of the plasmon depends on the real and imaginary parts of the metal dielectric function. Thus, for blue and green emitters one would typically use Al or Ag nanoparticles as the plasmonic material. For red emitters one can also use Au nanoparticles or alloys of Ag and Au. In general, the higher the bulk surface plasmon resonance, the more negative the real part of the dielectric function, and therefore the larger the feature size of the metal plasmonic nanostructures that will generate the same wavelength peak (i.e., the maximum extinction) of the LSPR. For example, when targeting a blue phosphorescent emitter with peak wavelength between 440-490 nm, for Ag nanostructures the preferred feature size is between 2 and 200 nm, more preferably between 2 and 100 nm, most preferred between 2 and 50 nm. For Al nanostructures, the preferred feature size is between 2 and 500 nm. The advantage of using Al as the plasmonic metallic nanostructure is that as the feature size of the nanostructures gets larger the efficiency of scattering also increases. For the films of nanocrystals, as the size and therefore volume fraction of the nanocrystals increase with respect the volume fraction of a matrix, the dielectric constant of the medium also changes. Therefore, the scattering efficiency and resonance wavelength depend on the size of the nanocrystals and the contrast in dielectric constant between that of the nanocrystals and that of the surrounding matrix.

The wavelength of the maximum extinction of the LSPR of the plasmonic nanostructures does depend on the material (based on their real and imaginary parts of the dielectric constants) and in the case of non-spherical nanostructures, the aspect ratio of the nanostructures, can affect the wavelenth of maximum extinction of the LSPR. The greater the aspect ratio the greater the wavelength of the maximum extinction of the LSPR wavelength will be. For example, for disc-shaped metal film nanostructures, as the feature size of a disc increases for a given thickness of the material, the greater its aspect ratio will be and therefore its LSPR wavelength will increase. Same trend will be true for rod-shaped nanostructures. For example, when targeting a blue phosphorescent emitter with peak wavelength between 440-490 nm using non-spherical Al nanostructures having feature size between 2 and 500 nm, the thickness of the Al nanostructures would preferably be controlled to be less than 50 nm, which would provide the aspect ratio appropriate to control the wavelength. For plasmonic nanostructures having different shapes, the feature size and the thickness will need to be adjusted to achieve the desired LSPR.

Figure 5:
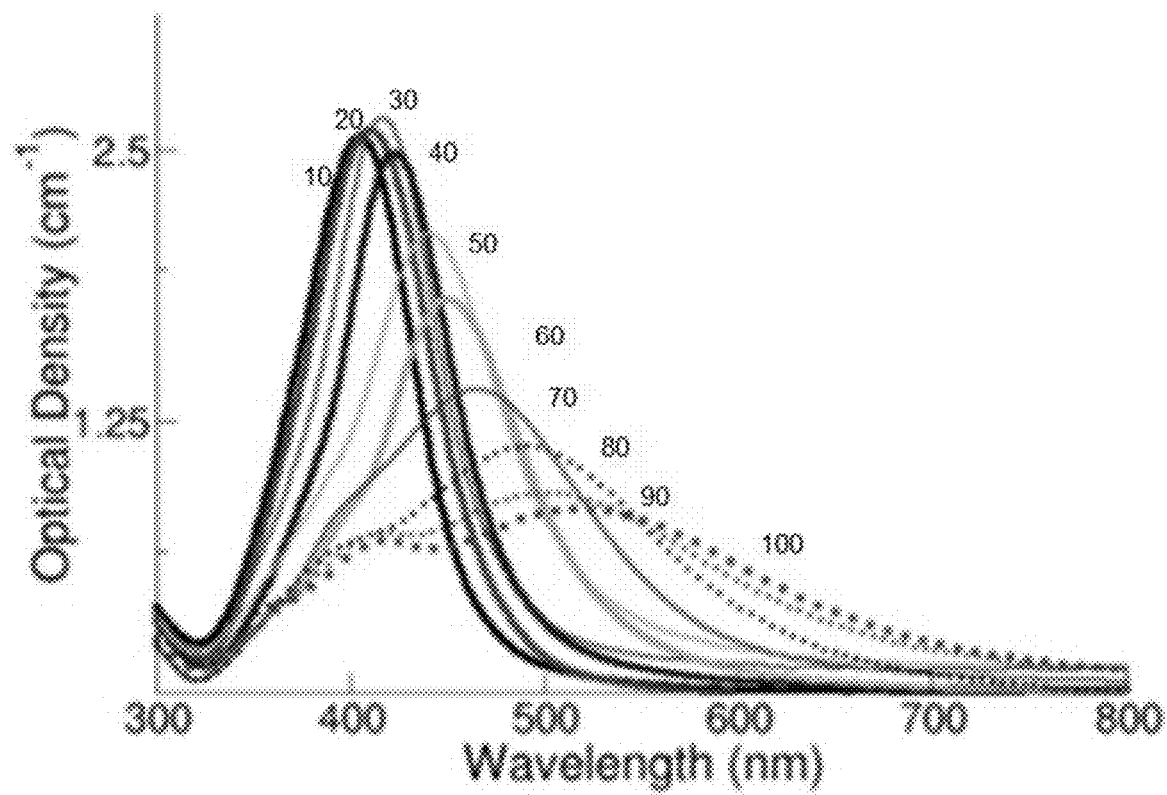
FIG. 5 is a plot of the extinction spectrum of Ag nanostructures as a function of nanostructure size.

The peak of the extinction (i.e., the maximum extinction) will shift to longer wavelengths when the feature size of the nanostructure increases. Thus, to have a large feature size plasmonic nanostructure that has the wavelength of the maximum extinction of the LSPR between 440-490 nm requires a material with a very high energy bulk plasmonic resonance such as Al. The size of the nanostructure is also important for tuning the wavelength of the maximum extinction of the LSPR to match the peak emission wavelength of the emitter. Typically, as the nanostructure feature size becomes smaller the wavelength of the maximum extinction of the LSPR shifts to shorter wavelength (higher energy). FIG. 5 shows a plot of the extinction spectrum of Ag nanostructures as a function of their feature size. The Ag nanostructures are particles having diameters ranging from 10 to 100 nm (each plot line is labeled with the corresponding diameter) at a mass concentration of 0.02 mg/mL provided by Sigma-Aldrich company.

The phenomena here are the result of the spectral alignment between the wavelength of the maximum extinction of the a LSPR of the nanostructured metal and the emitter. A modification of the line shape of emission is not expected to occur for coupling between the emitter and a surface plasmon in bulk metals or smooth metal thin films. Here we use plasmonic metal nanostructures featuring free surfaces. Optical excitation causes the electrons in the metal to be "confined" and oscillate in the nanostructures creating the LSPR. This enables spectral alignment between the emitter and the nanostructures leading to line shape engineering.

According to some embodiments, the plasmonic metal nanostructures can be colloidal nanoprticles. Colloidal nanoparticles will have a ligand which adds solubility/dispersibility to the colloidal nanoparticles. The chemical composition of the ligand can be tuned to provide solubility/dispersibility in a number of solvents including polar and non-polar organic solvents and water.

According to some embodiments, the plasmonic metal nanostructures can be patterned metallic films. When using a patterned metallic film, the films are patterned in 2-dimensions and the maximum feature size is as defined above for the wavelength of the emitter and the metal being used.

Preferably, such patterned plasmonic metallic film is at least one set of gratings formed of wavelength-sized or sub-wavelength-sized features that are arranged periodically, quasi-periodically, or randomly, or sub-wavelength-sized features that are arranged periodically, quasi-periodically, or randomly. In one preferred embodiment, the wavelength-sized features and the sub-wavelength-sized features can have sharp edges.

The patterned plasmonic metallic film can be fabricated in a number of ways. The most precise methods include: photolithography, imprint lithography, or electron beam lithography. Quasiperiodicity may be achieved through depositing on, or templating the metallic film with, a self-assembled layer. The self-assembled layer can be self-assembled colloidal nanoparticles or self-assembled polymer template followed by metal deposition. Quasiperiodic or random patterning may be achieved through roughening the substrate of the OLED device to add texture to the enhancement layer. Any of these methods may be used to pattern a solid metallic film to form a patterned plasmonic metallic film. The patterned plasmonic metallic film may either be patterned as part of the OLED fabricating process steps or the metallic film may be patterned on an alternative substrate and then place on the OLED device. Placement methods can include stamping, wafer bonding, wet transfer printing, dry transfer printing, and ultrasonic bonding.

Figure 6:
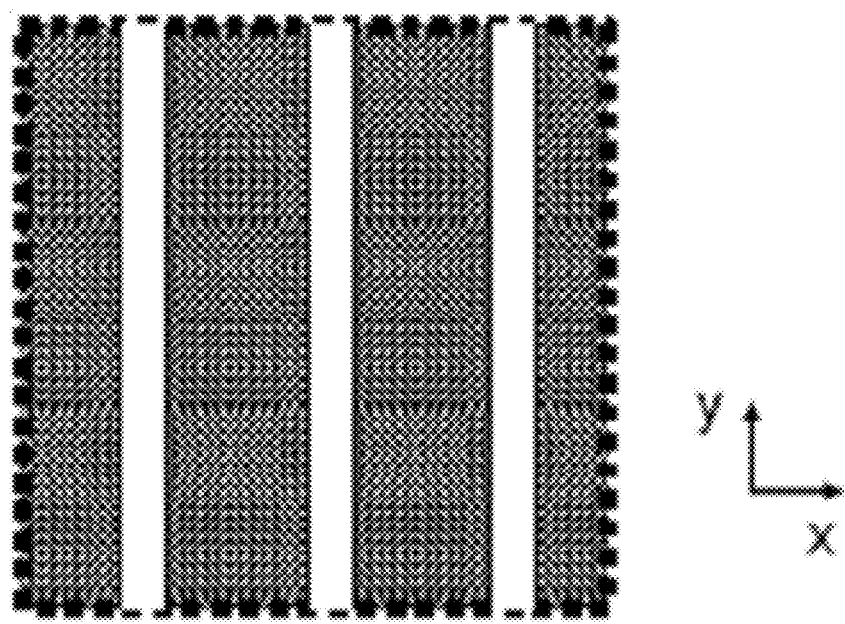
FIG. 6 is a top down view of an example of a 2 dimensional pattern of a patterned plasmonic metallic film.

Periodically patterned metallic film may also be referred to as gratings. In a 2-dimensional grating, the structural features forming the grating, the wavelength-sized or sub-wavelength-sized features, are arranged in a periodic pattern that is uniform along one direction (i.e., in x-direction or y-direction as labeled in FIG. 6) in the plane of the metallic film. The top-down view of FIG. 6 illustrates an example. In FIG. 6, the dark regions and the white regions illustrate the two different materials forming the patterned metallic film. As understood by those skilled in the art, either material (i.e., the dark regions or the white regions in the figures) can be considered to be the wavelength-sized or sub-wavelength-sized features forming the grating.

The patterned metallic film can be formed as at least one set of gratings. In 2-dimensional patterned grating embodiments where one film layer has one grating pattern, the grating can have a periodic pattern, wherein the wavelength-sized or sub-wavelength-sized features are arranged uniformly along one direction. The wavelength-sized or sub-wavelength-sized features can be arranged with a pitch of 100-2000 nm with a 10-90% duty cycle, and more preferably 20-1000 nm with a 30-70% duty cycle. The pattern may be composed of lines or holes in the metallic film. However the pattern does not need to be symmetric. It could be locally patterned over the distance of 1 micrometer and then have no patterning for several micrometers before repeating the pattern again. By applying this asymmetric patterned metallic film to shape the emission of an emissive layer with multiple emitters, we can have regions of the substrate which are patterned to change the spectral line shape of one color emitter while other regions of the substrate can be patterned to modify the spectral line shape of another color emitter.

In some embodiments of the electroluminescent device such as an OLED, the plasmonic metal nanostructure may be used at 1) the interface between the transparent front electrode and the HTL or in place of the transparent front electrode, 2) within the OLED stack of HTL, EML, or ETL, or 3) at the interface between the ETL and the back cathode. The plasmonic nanostructure should be placed in proximity to the emitter, to ensure the electric field of the LSPR has a strong influence on the emitter, but not too close (e.g. typically greater than 2 nm or preferably less than 5 nm, depending on the metal selected) to prevent quenching. However the effect diminishes as a function of distance between the plasmonic metal nanostructure and the emitter. Thus the preferred maximum distance for the plasmonic metal nanostructure from the emitter is 100 nm, more preferably 75 nm, and most preferably 50 nm. Thus, in some embodiments, the layer of plasmonic metal nanostructure having a LSPR is to be disposed at a distance greater than 2 nm but less than 100 nm from the emitter layer.

In addition to using the nanostructures for enhancing the electric field using the LSPR, the plasmonic metal nanostructures also exhibit a negative value of the real component of the refractive index which is wavelength dependent. In the effective medium approximation the local dielectric constant can be considered to be the volume fraction of material weighted by the index of refraction of the material. By using nanostructures with negative refractive index, localized pockets of effective medium with significantly different refractive index can be constructed that have specific wavelength dependencies. In an ideal case, the effective index of refraction could be made to approach zero or correspondingly the dielectric function c of the material can approach zero for a specific range of wavelengths. This could be engineered to enhance outcoupling of a desired band of wavelengths and/or suppress the outcoupling of undesired wavelengths. Thus, by varying the metallic nanostructures fraction and shape, a color tuning local filter can be constructed which will also modify the line shape of emission.

EXAMPLES

Figure 3A:
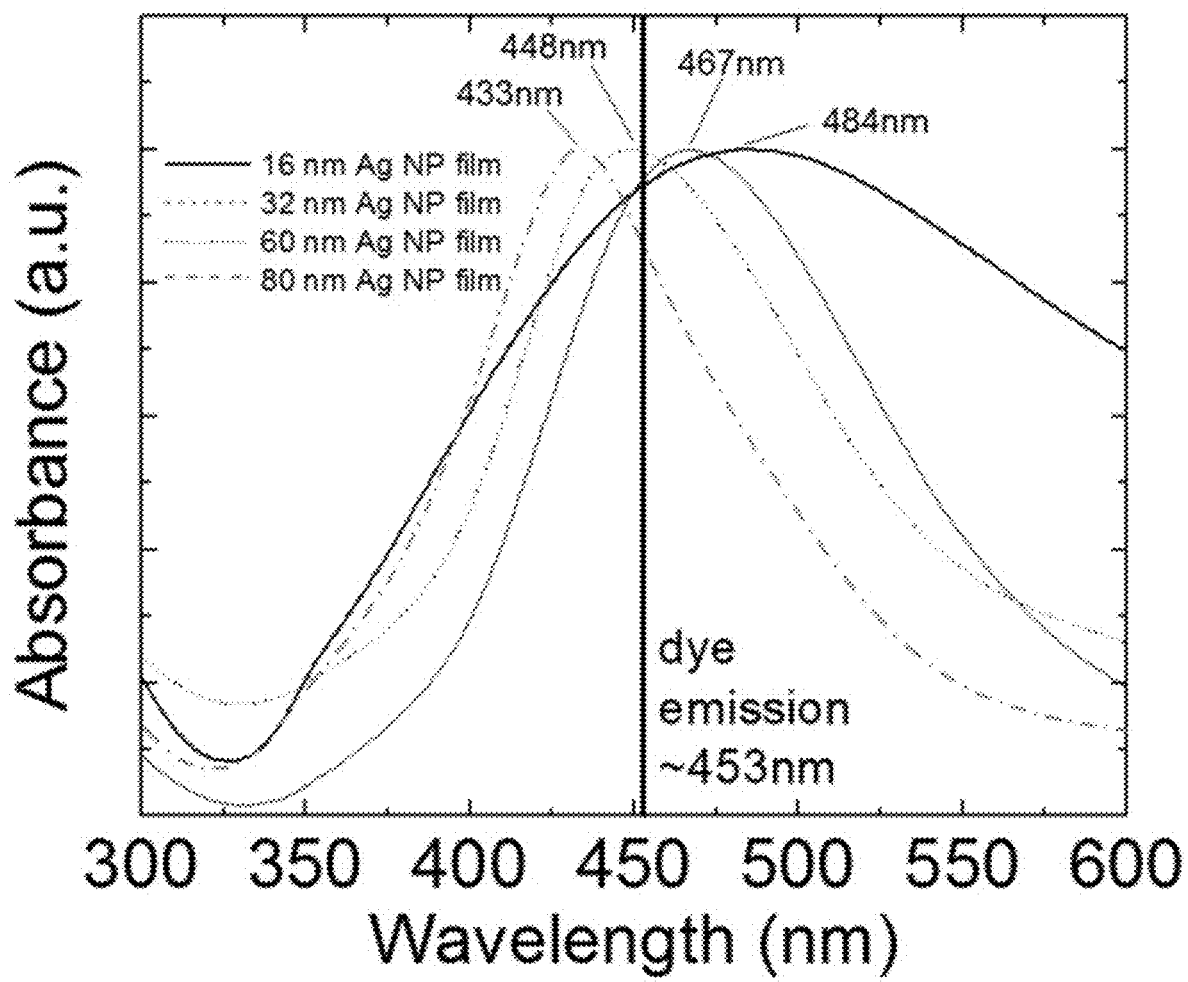
FIG. 3A is a normalized plot showing the extinction spectrum of the LSPR of 5 nm Ag nanoparticle films of different thicknesses.
Figure 3B:
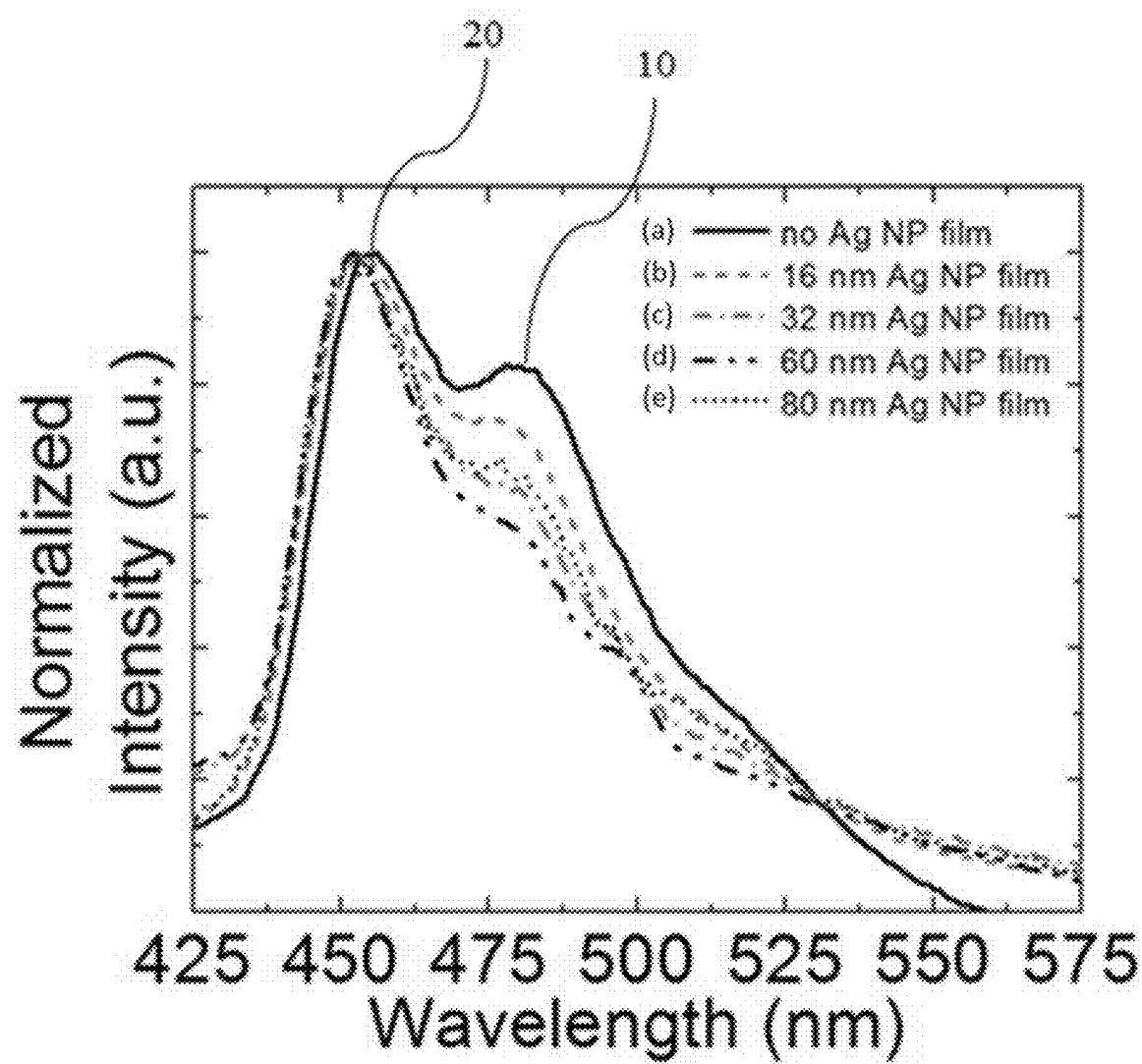
FIG. 3B shows emission spectrum of blue organometallic phosphor place in proximity to the Ag nanoparticle films of FIG. 3A.

In some examples, inventors were able to tune the wavelength of the maximum extinction of the LSPR of a film of metallic nanostructures that are nearly spherical with a fixed diameter. The nanostructures are 5 nm in diameter and composed of Ag. Academic literature typically refers to these as "colloidal metallic nanoparticles" or "Ag nanoparticles" and those terms apply here. By varying the thickness of the Ag nanoparticle film, inventors were able to fine tune the wavelength of the maximum extinction of the LSPR over the spectral range relevant to blue organometallic emissive materials. This tuning is a requirement to enable line shape engineering. FIGS. 3A and 3B illustrate systematic tuning of the 5 nm Ag nanoparticle film and its line shape engineering effect on a blue organometallic complex. FIG. 3A is a normalized plot showing the extinction spectrum of the LSPR of 5 nm Ag nanoparticle films of different thicknesses. Ag nanoparticle films having thicknesses 16 nm, 32 nm, 60 nm, and 80 nm are represented. The corresponding peak extinction (absorption and scattering) wavelengths were 484 nm, 467 nm, 448 nm, and 433 nm, respectively. The vertical line at 453 nm represents the desired peak emission wavelength of the blue organometallic emissive compound. Note here that the nanostructures are in electronic communication and that as the thickness of the Ag nanostructure film increases the peak extinction wavelength of the LSPR decreases as the coupling between the nanoparticles increases and the material on the whole looks more like bulk Ag. Thus, by allowing electronic communication between nanostructures we enable additional tuning of the LSPR via the number of layers of the nanostructures. If the nanostructures were prevented from electronic communication (as can be obtained by insulating the surface) then the LSPR would no longer be a function of the thickness of the nanostructure film.

FIG. 3B shows emission spectra of blue organometallic phosphor placed in proximity to each of the Ag nanoparticle films of FIG. 3A. Surprisingly, the line shape of the emission spectrum of the blue organometallic phosphor changed with the change in the thickness of the Ag nanoparticle film. The intrinsic emission spectrum (a) of the blue organometallic phosphor (i.e., without any Ag nanoparticle film) exhibit an undesired secondary emission peak 10 that has a longer wavelength than the primary emission peak 20 at 453 nm. The emission spectra (b), (c), (d), and (e) correspond to the effects of the LSPR from the Ag nanoparticle films of 15 nm, 28 nm, 60 nm, and 120 nm thick, respectively. As can be seen, the emission spectrum (d), corresponding to the Ag nanoparticle film thickness of 60 nm, exhibited the lowest secondary emission peak without affecting the primary emission peak. This means that for this particular blue organometallic phosphor, a 60 nm thick Ag nanoparticle film provided in proximity to the emitter layer can be used to tune the line shape of the phosphor's emission spectrum to maximize the peak emission at the peak 20. It should be noted here that the nanoparticle films in proximity of an organometallic phosphor may also increase the total emitted light from the organometallic phosphor.

Figure 4:
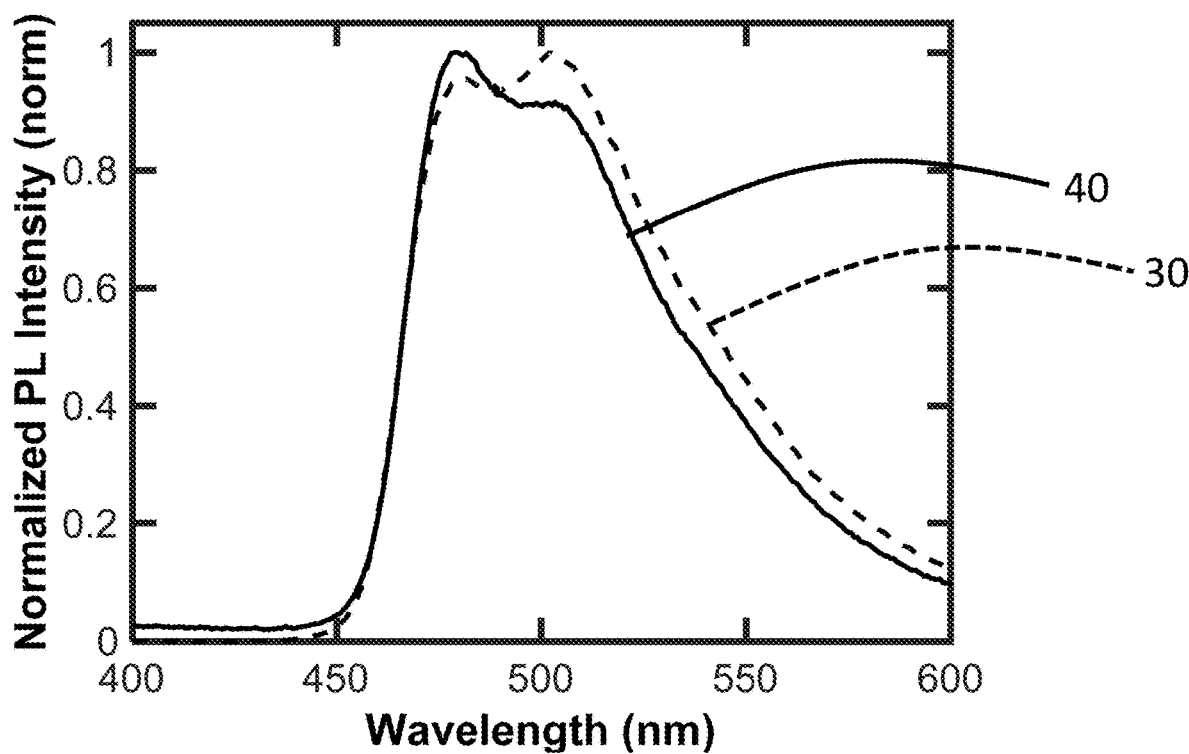
FIG. 4 illustrates this schematically for a hypothetical organometallic phosphor

This effect can be used to tune the peak emission wavelength of an organometallic phosphor. FIG. 4 illustrates this schematically for a hypothetical organometallic phosphor. The peak wavelength of the emission spectrum 30 without a metallic nanostructure film is about 502 nm. By providing an appropriate metallic nanostructure film in proximity to the emitter layer, one can change the line shape of the emission spectrum of the emitter so that its peak is at 479 nm as illustrated by the emission spectrum 40.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

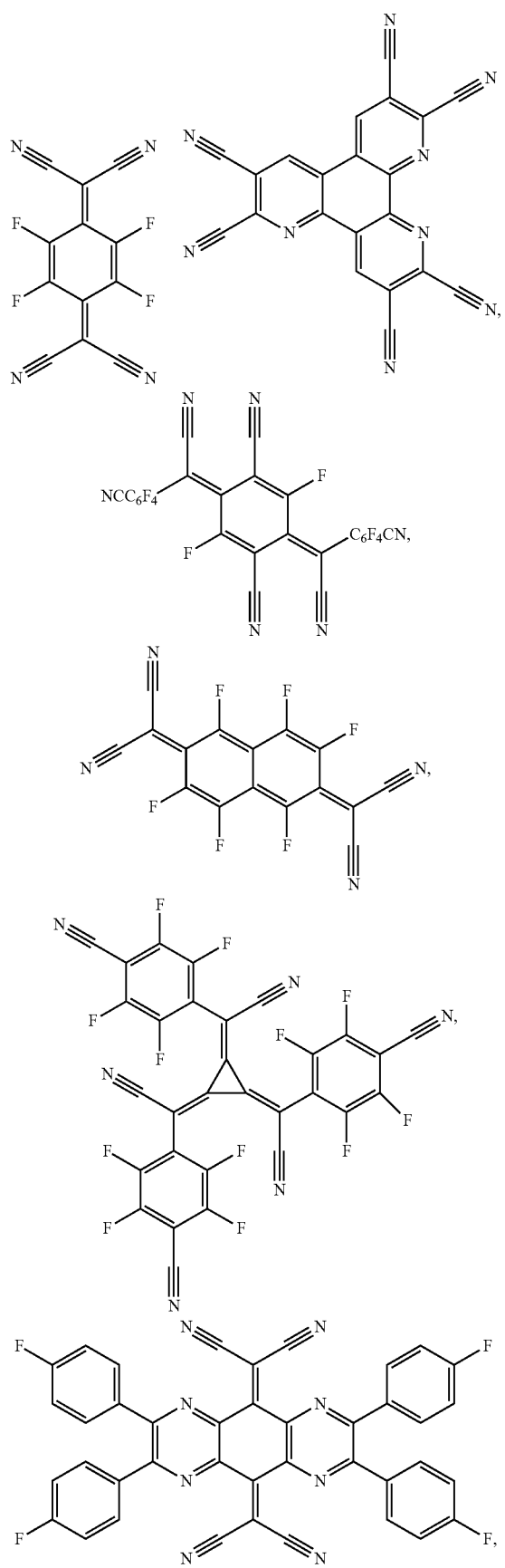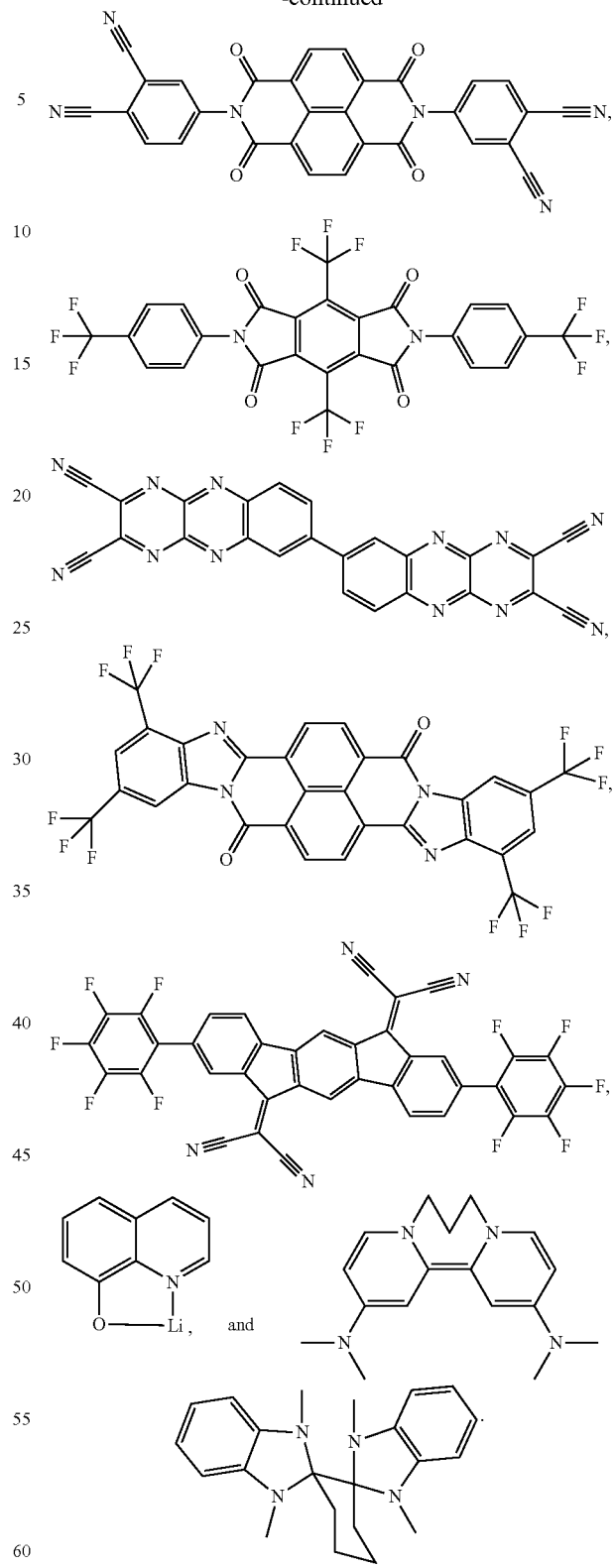
HIL/HTL:
A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

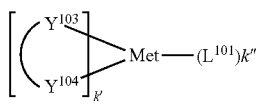

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

Emitter:

An emitter example is not particularly limited, and any compound may be used as long as the compound is typically used as an emitter material. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450,

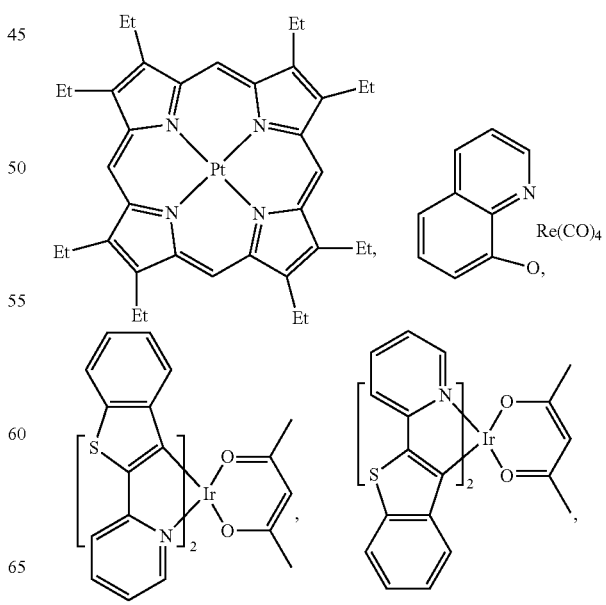

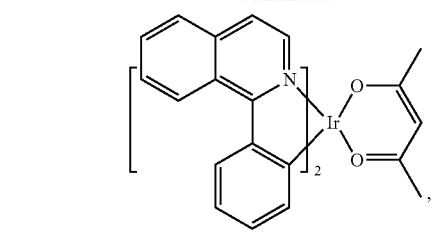
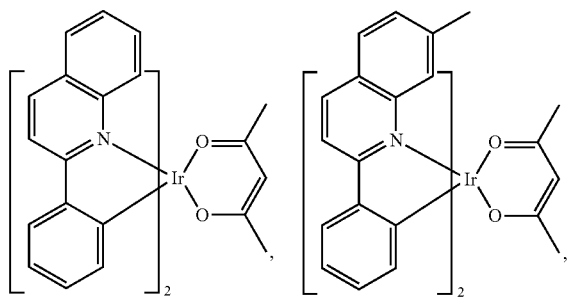
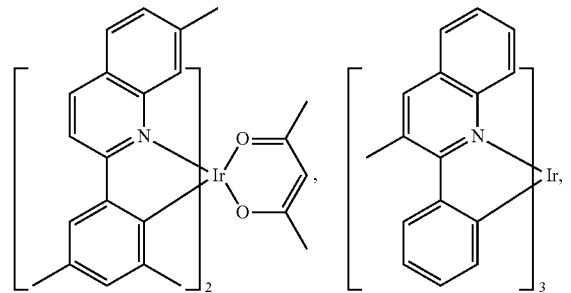
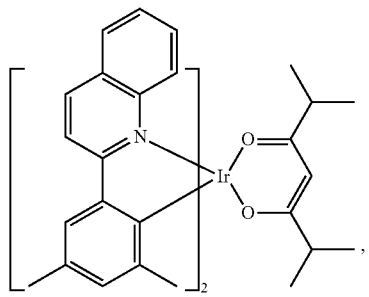
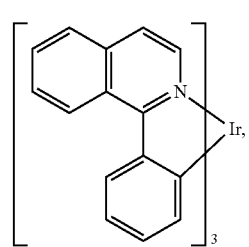
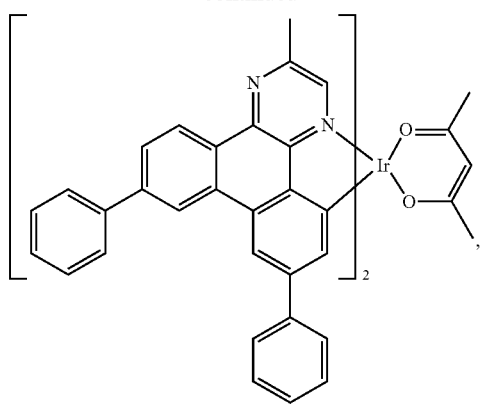
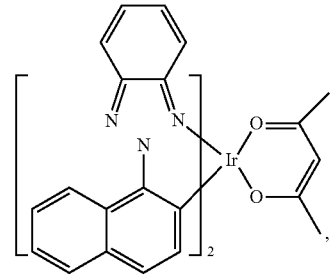
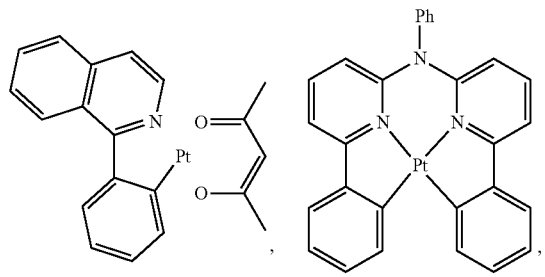
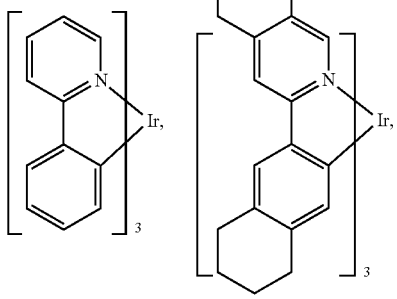
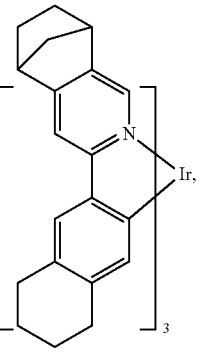

-continued
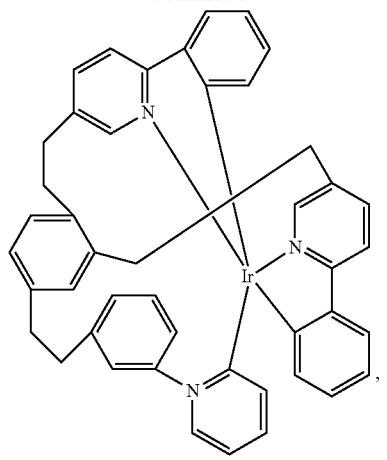
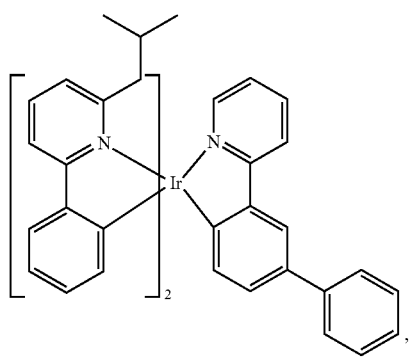
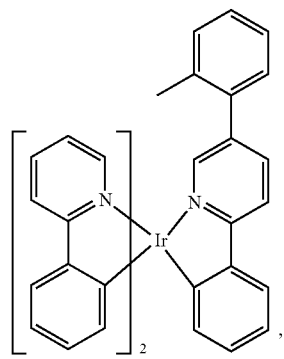
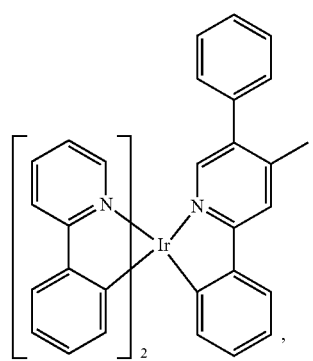
-continued
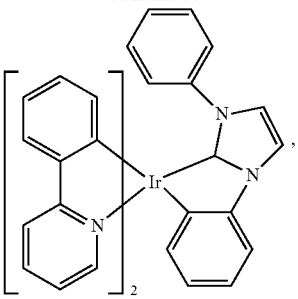
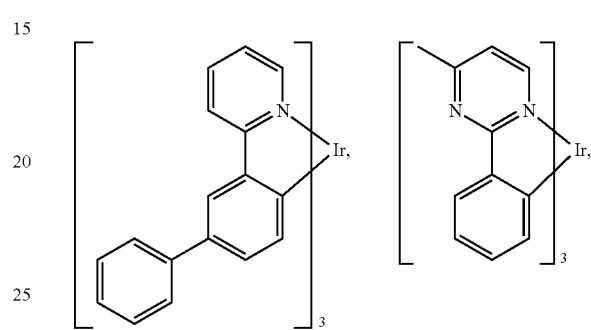
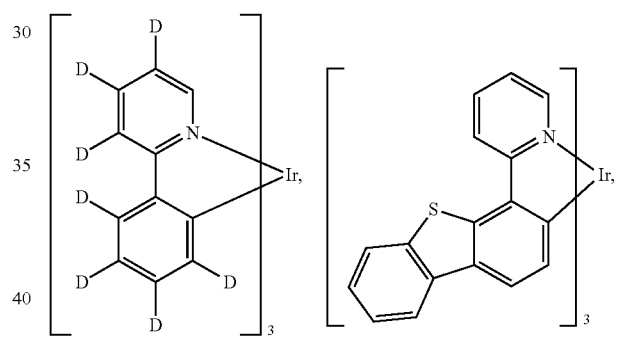
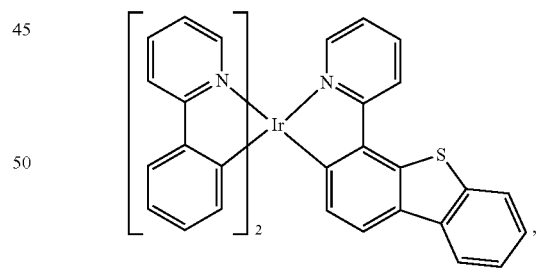
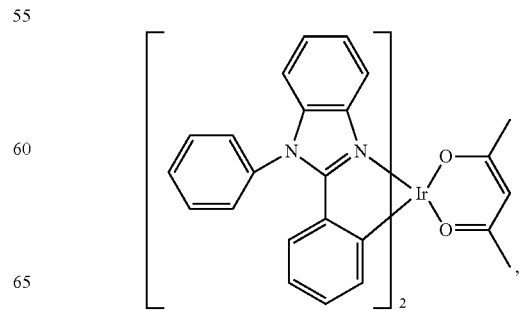

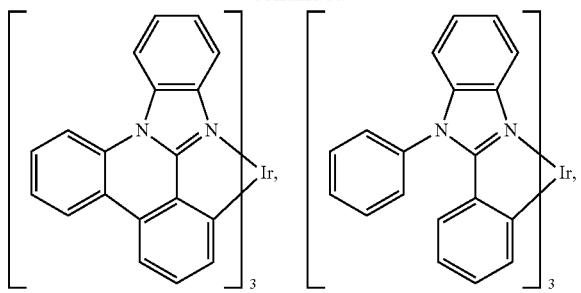
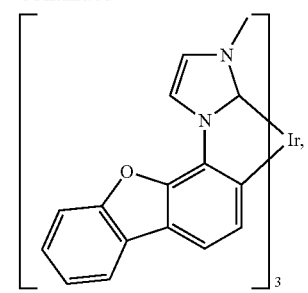
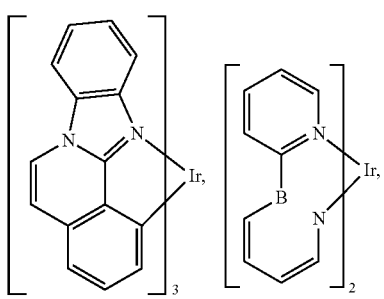
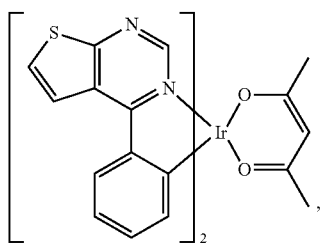
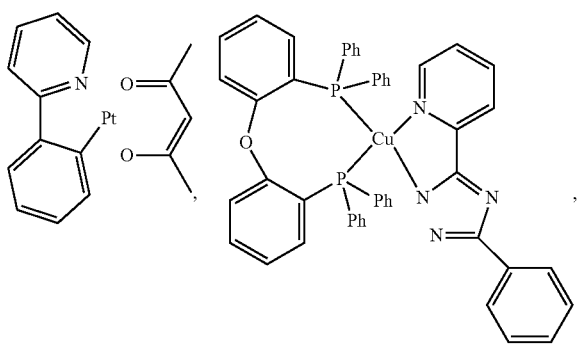
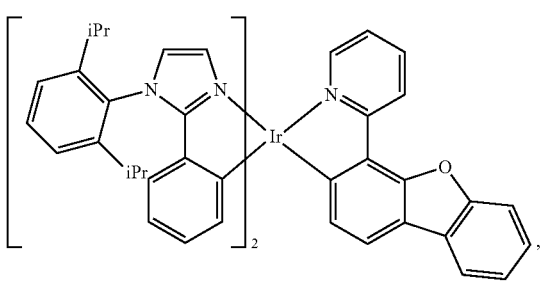
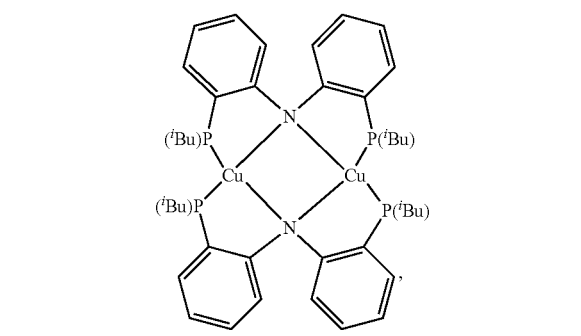
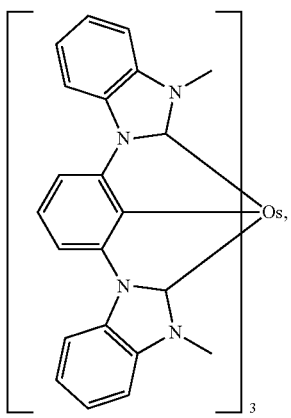
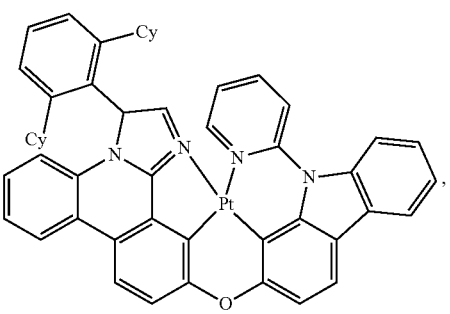

-continued
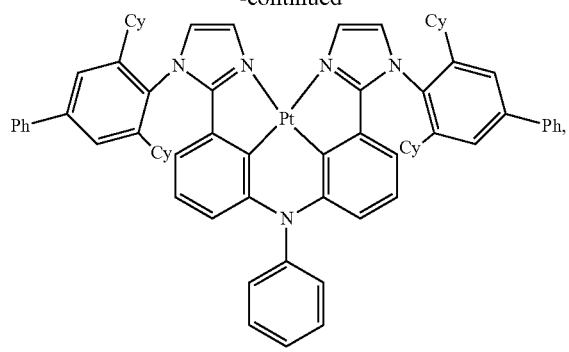
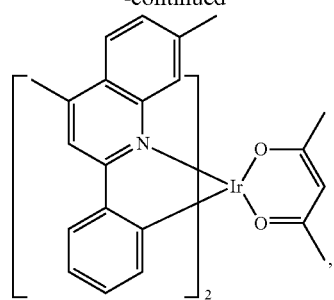
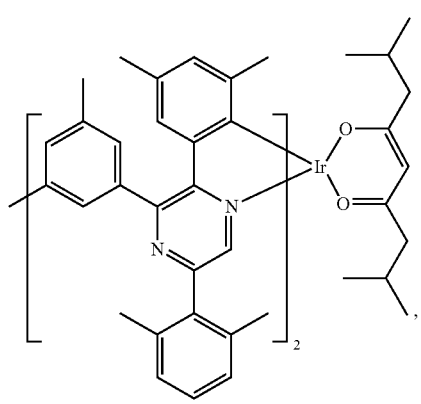
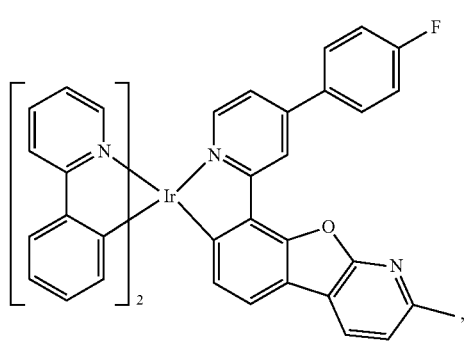
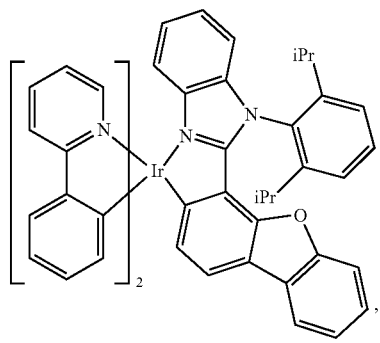
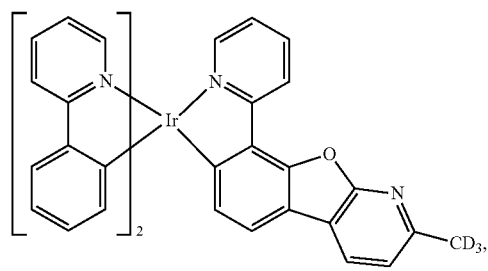
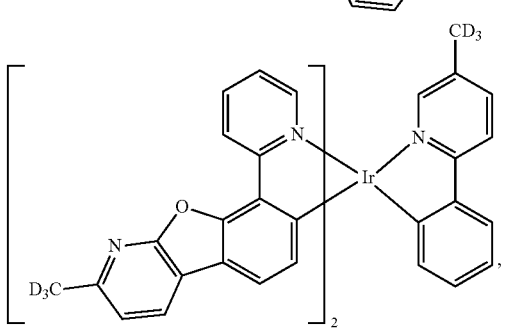
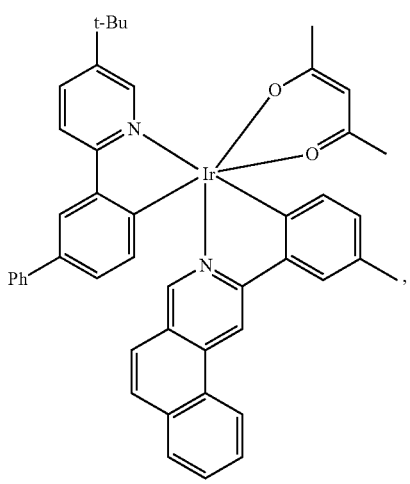
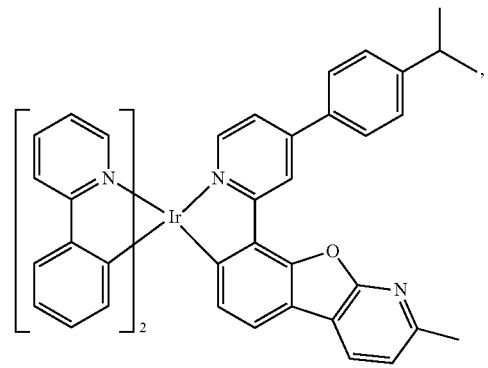

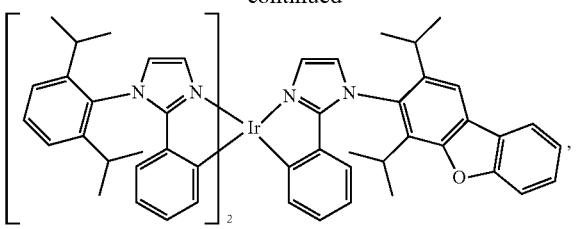
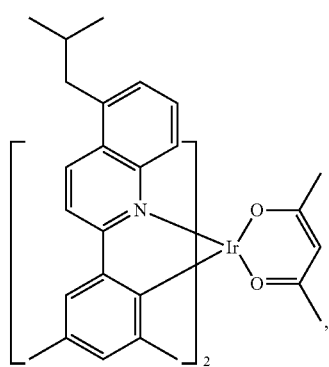
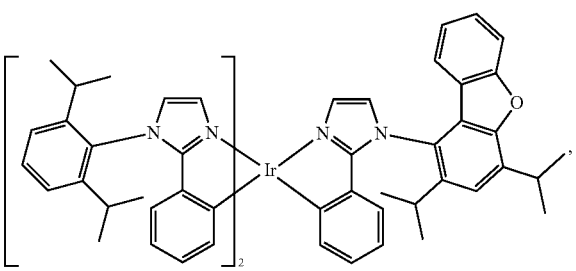
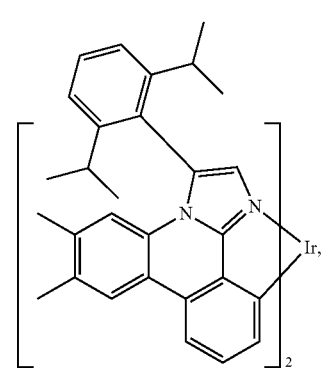
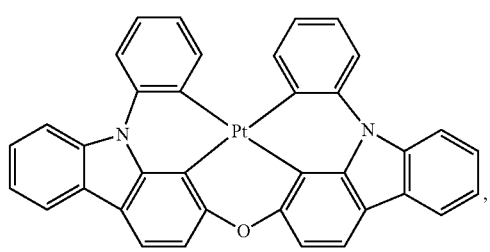
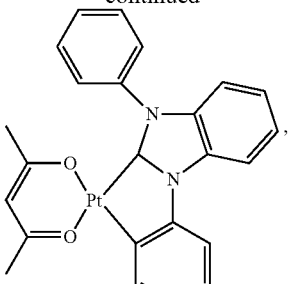
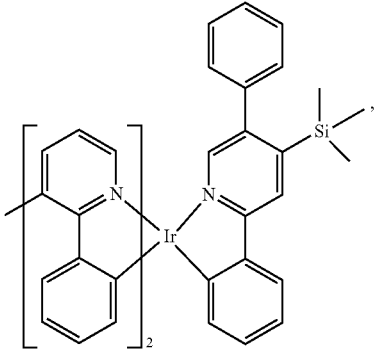
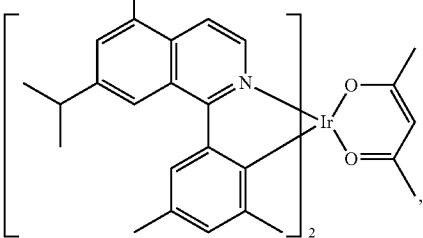
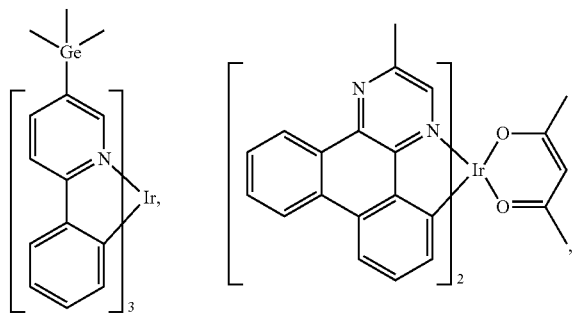
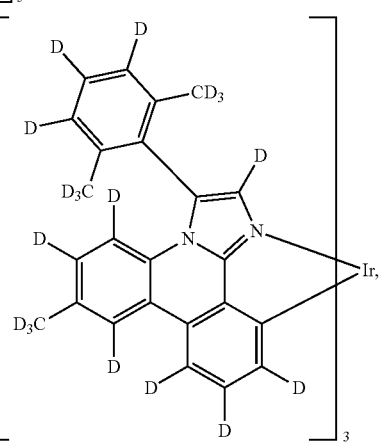

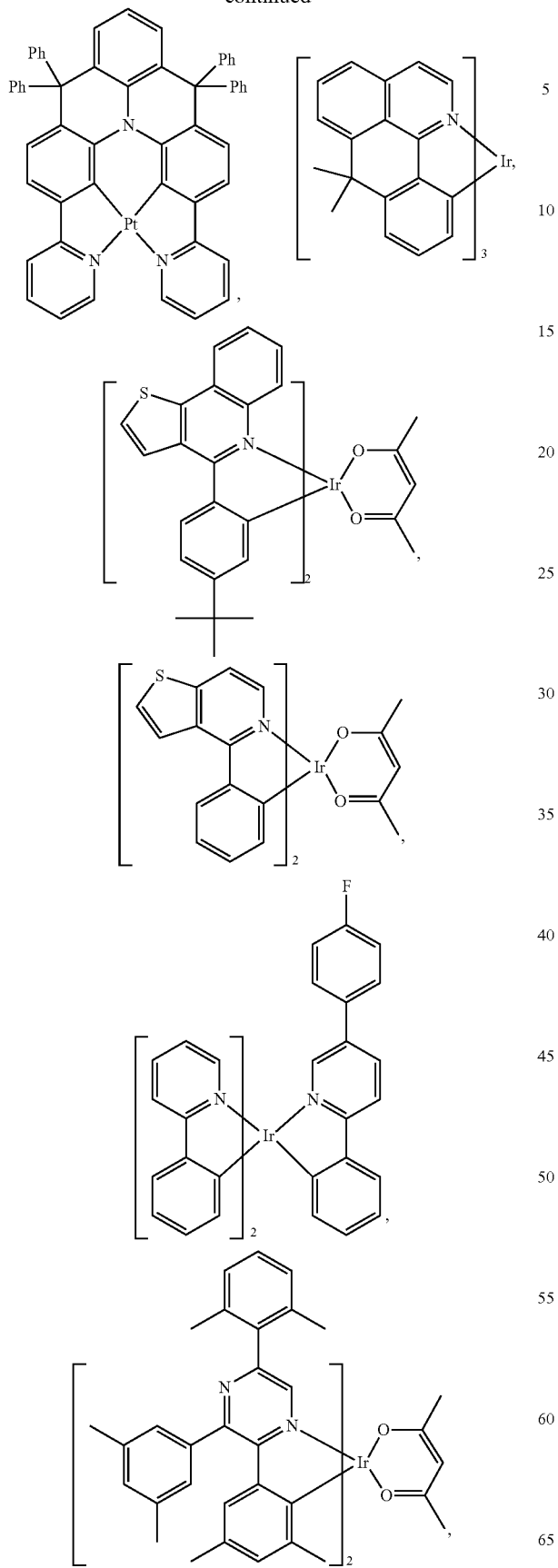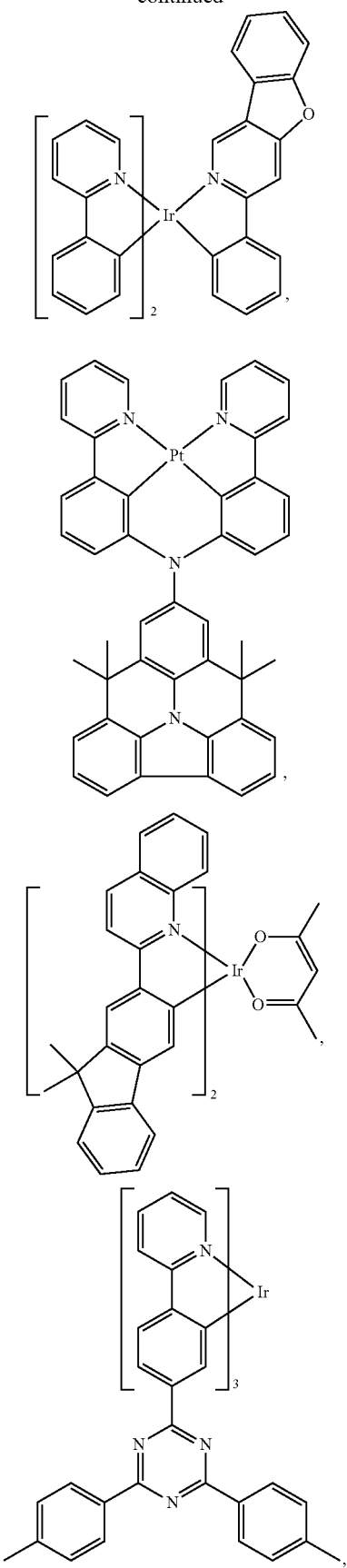

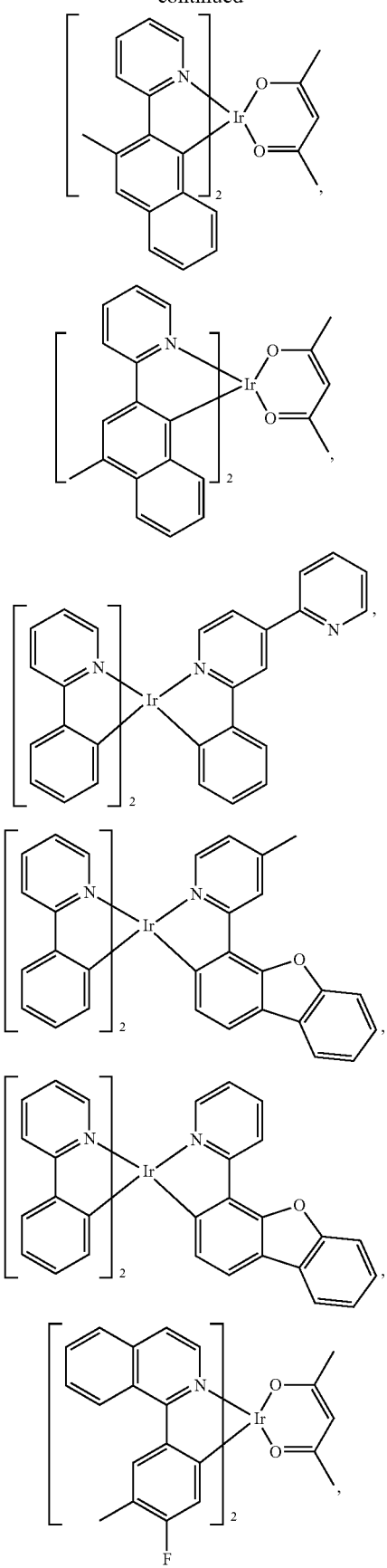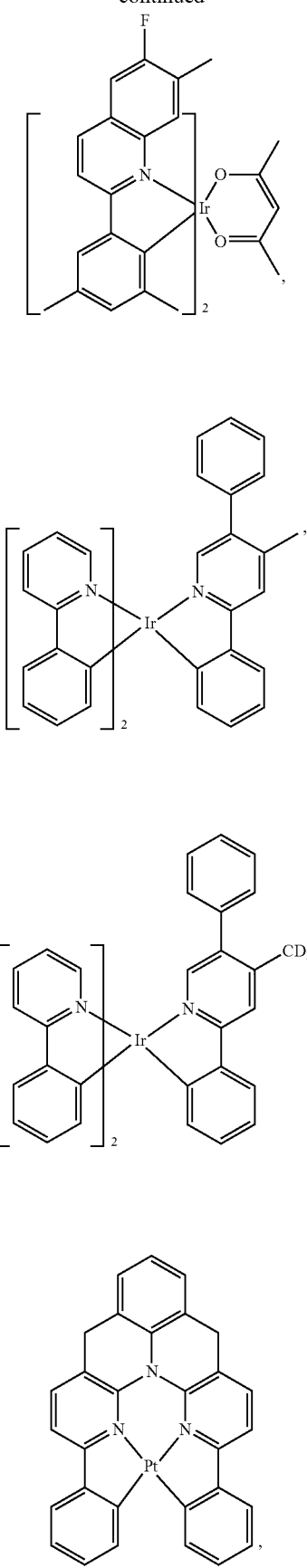

-continued
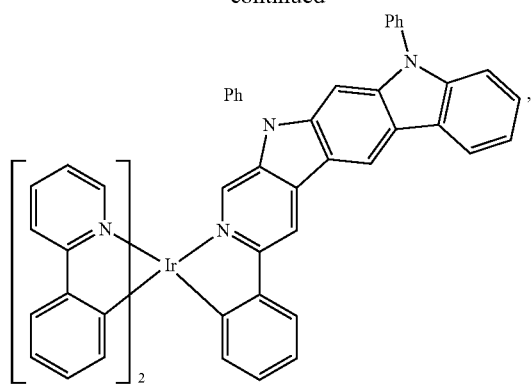
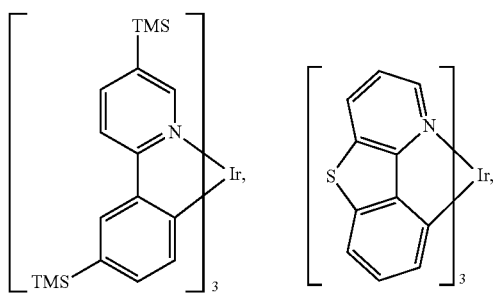
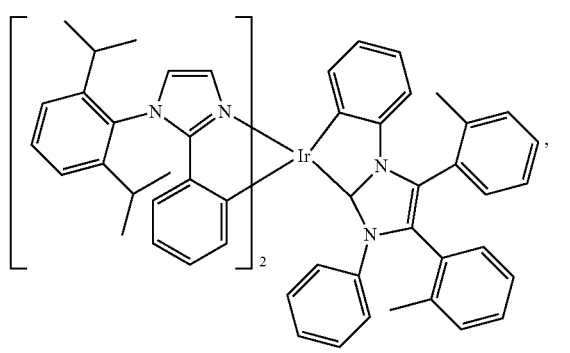
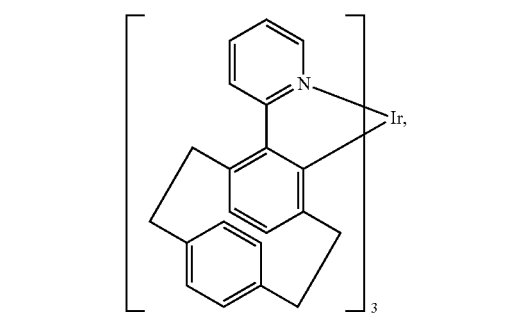
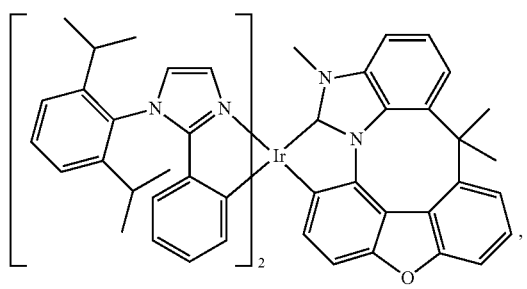
-continued
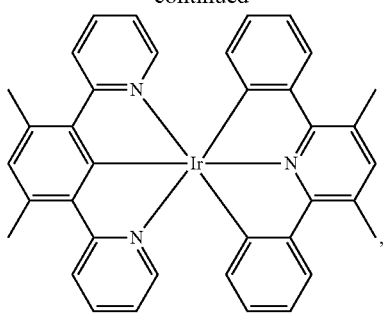
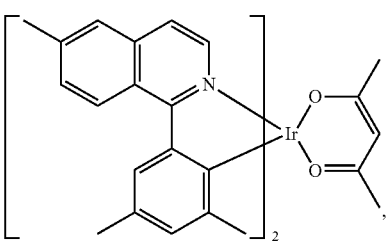
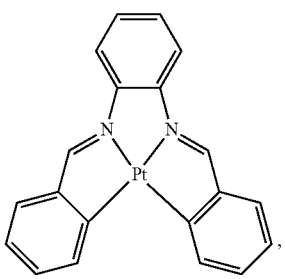
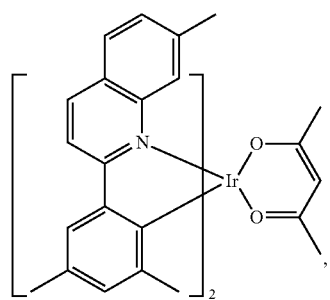
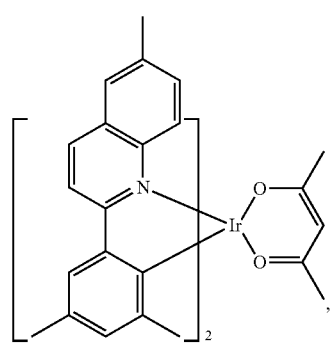

-continued
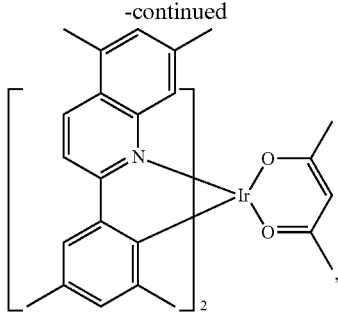
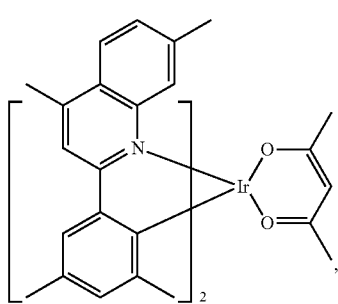
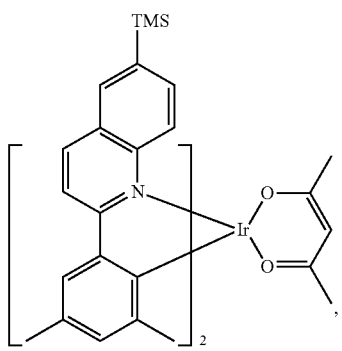
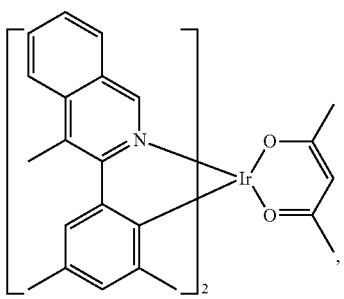
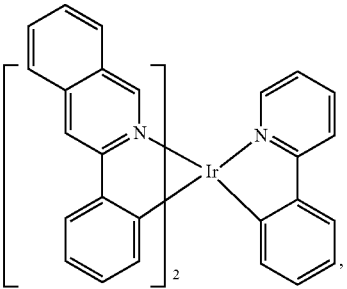
-continued
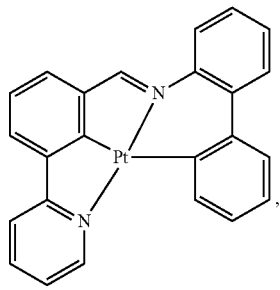
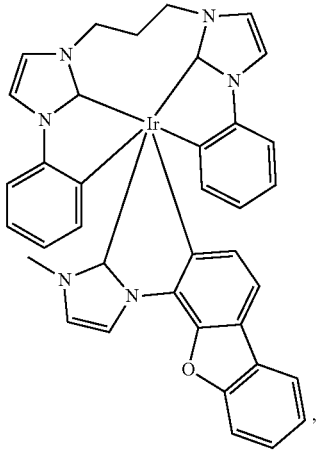
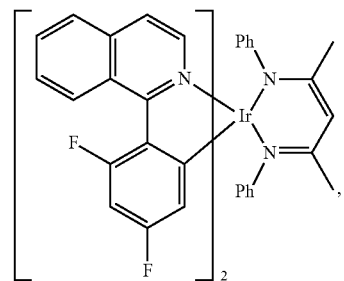

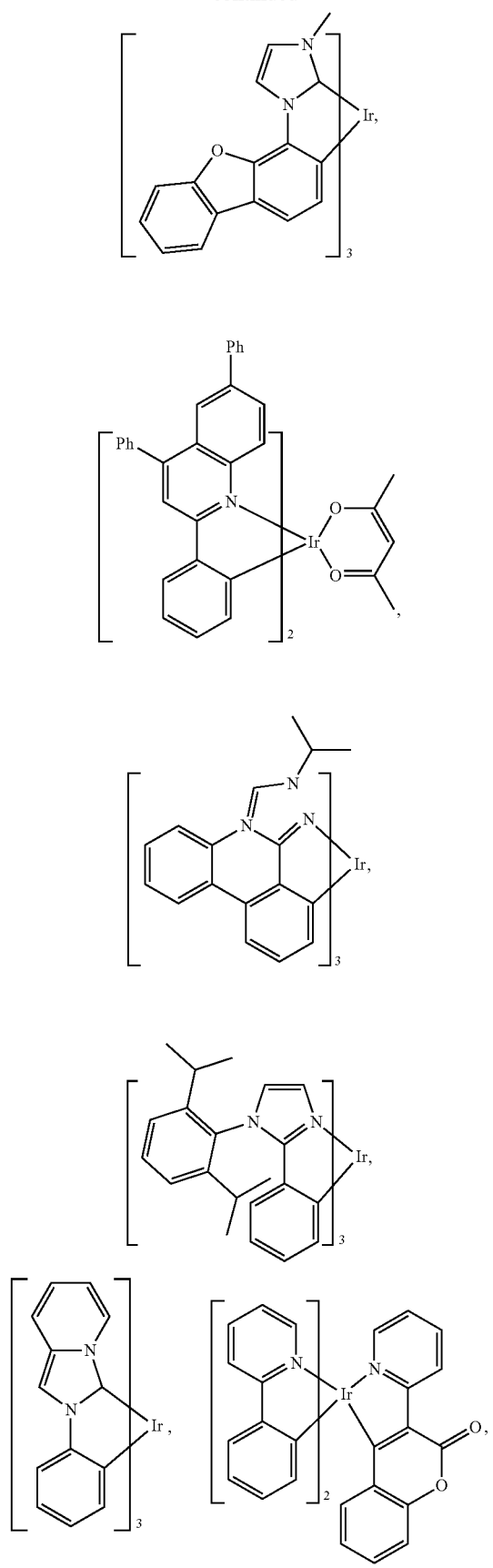
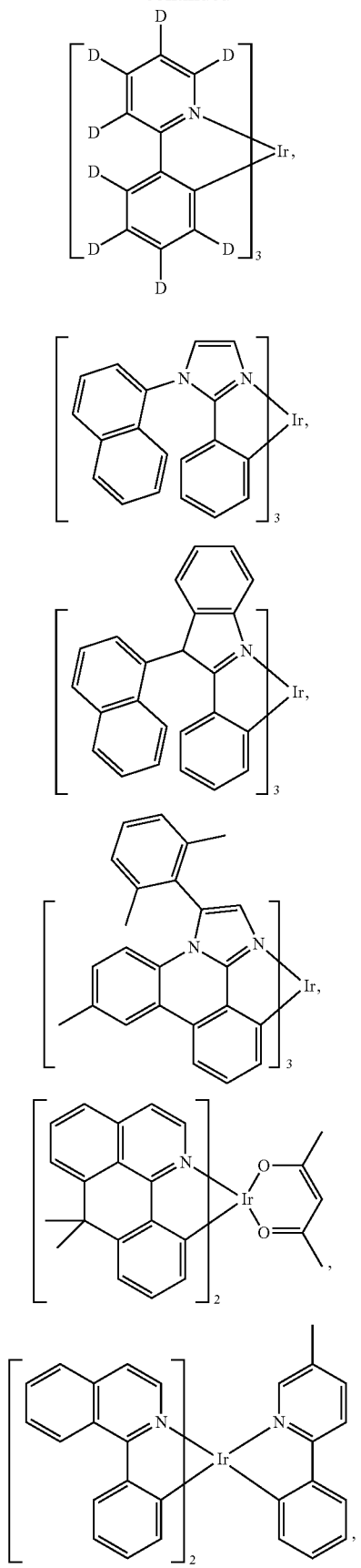

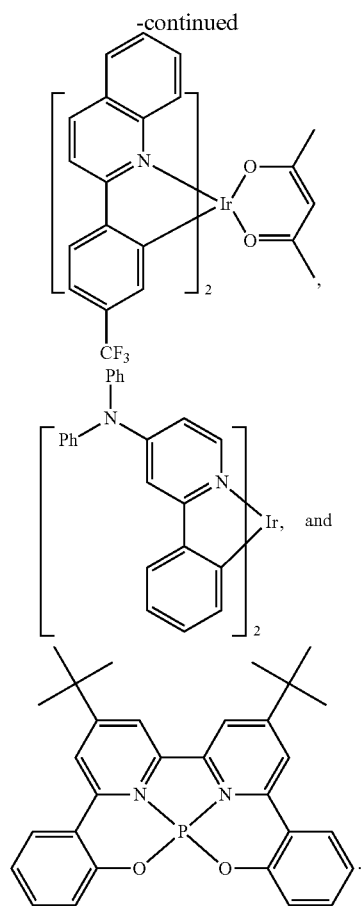

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

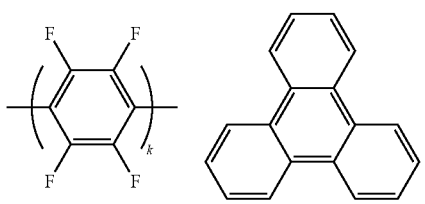

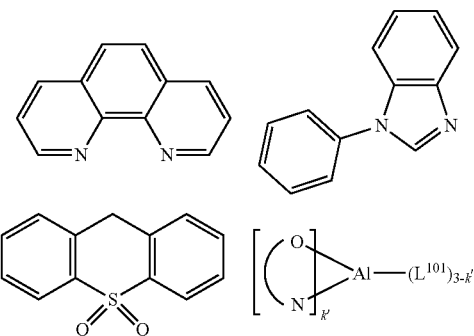

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

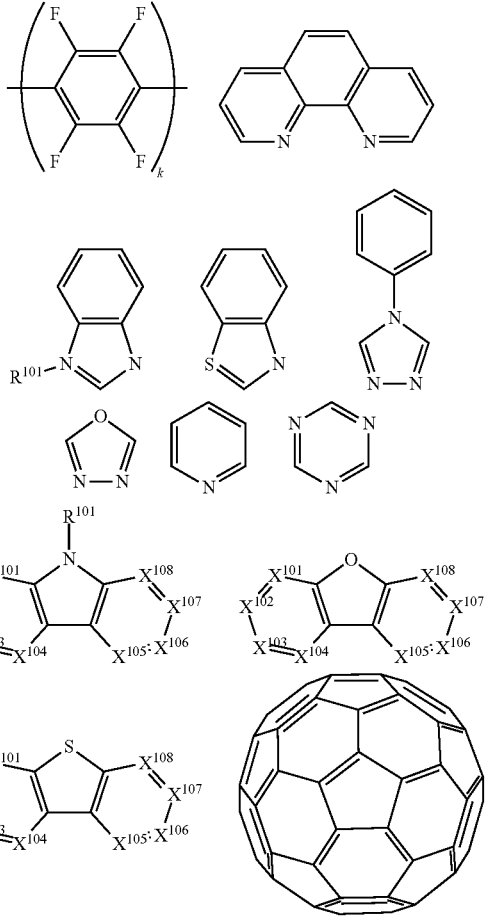

-continued

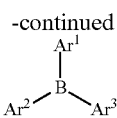

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A method for fabricating an OLED that has a modified emission spectrum line shape of an organic light emitter material in the OLED, wherein the OLED comprises the organic emitter material in its emissive layer, and a first layer of plasmonic metallic nanostructures, wherein the first layer of plasmonic metallic nanostructures has a maximum extinction of the localized surface plasmonic resonance (LSPR), and wherein the organic emitter material has a peak emission wavelength, said method comprising:

tuning the wavelength of the maximum extinction of the LSPR of the first layer of plasmonic metallic nanostructures to be within ±10 nm of the peak emission wavelength of the intrinsic emission spectrum of the organic emitter material; and depositing the tuned first layer of plasmonic metallic nanostructures greater than 2 nm from but less than 100 nm from the emissive layer, whereby reducing any secondary emission peak in the emission spectrum of the organic light emitter material.

2. The method of claim 1, wherein the wavelength of the maximum extinction of the LSPR of the first layer of plasmonic metallic nanostructures is within ±5 nm of the peak emission wavelength of the organic emissive material.

3. The method of claim 1, wherein the first layer of plasmonic metallic nanostructures comprises a plurality of plasmonic metal nanoparticles, and the tuning comprises:

selecting the plurality of plasmonic metal nanoparticles to be those having a particle size that results in the wavelength of the maximum extinction of the LSPR of the first layer of plasmonic metallic nanostructures to be within ±10 nm of the peak emission wavelength of the organic emitter material.

4. The method of claim 3, wherein the wavelength of the maximum extinction of the LSPR of the first layer of plasmonic metallic nanostructures is within ±5 nm of the peak emission wavelength of the organic emissive material.

5. The method of claim 1, wherein the first layer of plasmonic metallic nanostructures comprises a plurality of plasmonic metal nanoparticles, and the tuning comprises:

selecting the first layer of plasmonic metallic nanostructures to have a thickness that results in the wavelength of the maximum extinction of the LSPR of the first layer of plasmonic metallic nanostructures to be within ±10 nm of the peak emission wavelength of the organic emitter material.

6. The method of claim 5, wherein the wavelength of the maximum extinction of the LSPR of the first layer of plasmonic metallic nanostructures is within ±5 nm of the peak emission wavelength of the organic emissive material.

7. The method of claim 1, wherein the first layer of plasmonic metallic nanostructures comprises a plurality of plasmonic metal nanoparticles, and the tuning comprises:

selecting a material for the first layer of plasmonic metallic nanostructures from Al, Ag, and Au that results in the wavelength of the maximum extinction of the LSPR of the first layer of plasmonic metallic nanostructures to be within ±10 nm of the peak emission wavelength of the organic emitter material.

8. The method of claim 7, wherein the wavelength of the maximum extinction of the LSPR of the first layer of plasmonic metallic nanostructures is within ±5 nm of the peak emission wavelength of the organic emissive material.

9. The method of claim 1, wherein the first layer of plasmonic metallic nanostructures comprises a plurality of plasmonic metal nanoparticles, and the tuning comprises:

selecting the plurality of plasmonic metal nanoparticles to be those having a shape of discs, spheres, or rods that results in the wavelength of the maximum extinction of the LSPR of the first layer of plasmonic metallic nanostructures to be within ±10 nm of the peak emission wavelength of the organic emitter material.

10. The method of claim 9, wherein the plurality of plasmonic metal nanoparticles have a lateral dimension in the range of 2-400 nm.

11. The method of claim 9, wherein the plurality of plasmonic metal nanoparticles have a lateral dimension in the range of 5-200 nm.

12. The method of claim 9, wherein the wavelength of the maximum extinction of the LSPR of the first layer of plasmonic metallic nanostructures is within ±5 nm of the peak emission wavelength of the organic emissive material.

13. The method of claim 9, wherein the tuning comprises selecting the plurality of plasmonic metal nanoparticles to be those having a shape of discs or rods and selecting the plasmonic metal nanoparticles' aspect ratio that results in the wavelength of the maximum extinction of the LSPR of the first layer of plasmonic metallic nanostructures to be within ±10 nm of the peak emission wavelength of the organic emitter material.

14. The method of claim 1, wherein the OLED comprises an anode layer, a cathode layer, a hole transporting layer (HTL) and the emissive layer disposed between the anode layer and the cathode layer, and
depositing the tuned first layer of plasmonic metallic nanostructures within greater than 2 nm from but less than 100 nm from the emissive layer involves depositing the tuned first layer of plasmonic metallic nanostructures between the HTL and the anode layer.

15. The method of claim 1, wherein the OLED comprises an anode layer, a cathode layer, an electron transporting layer (ETL) and the emissive layer disposed between the anode layer and the cathode layer, and
depositing the tuned first layer of plasmonic metallic nanostructures within greater than 2 nm from but less than 100 nm from the emissive layer involves depositing the tuned first layer of plasmonic metallic nanostructures between the ETL and the cathode layer.

16. The method of claim 15, wherein the OLED further comprising a hole transport layer (HTL) disposed between the emissive layer and the anode layer, and wherein a second layer of plasmonic metal nanostructures is disposed between the HTL and the anode layer.

17. The method of claim 16, wherein each of the first and second layers of plasmonic metal nanostructures comprises a plurality of plasmonic metal nanoparticles, and the tuning comprises:
selecting the second layer of plurality of plasmonic metal nanoparticles to be those having a particle size that results in the wavelength of the maximum extinction of the LSPR of the first layer of plasmonic metallic nanostructures to be within ±10 nm of the peak emission wavelength of the organic emitter material.

18. The method of claim 17, wherein the wavelength of the maximum extinction of the LSPR of the second layer of plasmonic metallic nanostructures is within ±5 nm of the peak emission wavelength of the organic emissive material.

19. The method of claim 16, wherein each of the first and second layers of plasmonic metal nanostructures comprises a plurality of plasmonic metal nanoparticles, and the tuning comprises:
selecting the second layer of plurality of plasmonic metallic nanostructures to have a thickness that results in the wavelength of the maximum extinction of the LSPR of the first and second layers of plasmonic metallic nanostructures to be within ±10 nm of the peak emission wavelength of the organic emitter material.

20. The method of claim 19, wherein the wavelength of the maximum extinction of the LSPR of the second layer of plasmonic metallic nanostructures is within ±5 nm of the peak emission wavelength of the organic emissive material.

21. The method of claim 16, wherein the second layer of plasmonic metallic nanostructures comprises a plurality of plasmonic metal nanoparticles, and the tuning comprises:
selecting a material for the second layer of plasmonic metallic nanostructures from Al, Ag, and Au that results in the wavelength of the maximum extinction of the LSPR of the first layer of plasmonic metallic nanostructures to be within ±10 nm of the peak emission wavelength of the organic emitter material.

22. The method of claim 21, wherein the wavelength of the maximum extinction of the LSPR of the second layer of plasmonic metallic nanostructures is within ±5 nm of the peak emission wavelength of the organic emissive material.

23. The method of claim 16, wherein the second layer of plasmonic metallic nanostructures comprises a plurality of plasmonic metal nanoparticles, and the tuning comprises:
selecting the plurality of plasmonic metal nanoparticles to be those having a shape of discs, spheres, or rods that results in the wavelength of the maximum extinction of the LSPR of the first layer of plasmonic metallic nanostructures to be within ±10 nm of the peak emission wavelength of the organic emitter material.

24. The method of claim 23, wherein the plurality of plasmonic metal nanoparticles have a lateral dimension in the range of 2-400 nm.

25. The method of claim 23, wherein the plurality of plasmonic metal nanoparticles have a lateral dimension in the range of 5-200 nm.

26. The method of claim 23, wherein the tuning comprises selecting the plurality of plasmonic metal nanoparticles to be those having a shape of discs or rods and selecting the plasmonic metal nanoparticles' aspect ratio that results in the wavelength of the maximum extinction of the LSPR of the first layer of plasmonic metallic nanostructures to be within ±10 nm of the peak emission wavelength of the organic emitter material.

27. The method of claim 23, wherein the wavelength of the maximum extinction of the LSPR of the second layer of plasmonic metallic nanostructures is within ±5 nm of the peak emission wavelength of the organic emissive material.

* * * * *